United States Patent
Nakamura et al.

(10) Patent No.: US 7,141,113 B1
(45) Date of Patent: Nov. 28, 2006

(54) PRODUCTION METHOD FOR SILICON SINGLE CRYSTAL AND PRODUCTION DEVICE FOR SINGLE CRYSTAL INGOT, AND HEAT TREATING METHOD FOR SILICON CRYSTAL WAFER

(75) Inventors: Kozo Nakamura, Hiratsuka (JP); Toshiaki Saishoji, Hiratsuka (JP); Hirotaka Nakajima, Hiratsuka (JP); Shinya Sadohara, Hiratsuka (JP); Masashi Nishimura, Hiratsuka (JP); Toshirou Kotooka, Hiratsuka (JP); Yoshiyuki Shimanuki, Hiratsuka (JP)

(73) Assignee: Komatsu Denshi Kinzoku Kabushiki Kaisha, Hiratsuka (JP)

( * ) Notice: Subject to any disclaimer, the term of this patent is extended or adjusted under 35 U.S.C. 154(b) by 0 days.

(21) Appl. No.: 09/856,212

(22) PCT Filed: Nov. 19, 1999

(86) PCT No.: PCT/JP99/06477

§ 371 (c)(1), (2), (4) Date: May 18, 2001

(87) PCT Pub. No.: WO00/31325

PCT Pub. Date: Jun. 2, 2000

(30) Foreign Application Priority Data

| Nov. 20, 1998 | (JP) | ................................. 10/330713 |
| Mar. 23, 1999 | (JP) | ................................. 11/077166 |
| May 11, 1999 | (JP) | ................................. 11/129957 |

(51) Int. Cl.
 *C30B 33/02* (2006.01)

(52) U.S. Cl. .................... 117/3; 117/2; 117/13; 117/20; 438/795; 432/1

(58) Field of Classification Search ................ 117/13, 117/20, 2, 3; 438/795, FOR. 407; 432/1
See application file for complete search history.

(56) References Cited

U.S. PATENT DOCUMENTS 4,437,922 A * 3/1984 Bischoff et al. ............ 438/795

(Continued)

FOREIGN PATENT DOCUMENTS

EP  0866150  9/1998

(Continued)

OTHER PUBLICATIONS

Zulehner et al, Czochralski- Grown Silicon, 1982, Springer-Verlag Berlin Heidelberg, pp. 19 and 57-91.*

(Continued)

*Primary Examiner*—Yogendra N. Gupta
*Assistant Examiner*—Matthew J. Song
(74) *Attorney, Agent, or Firm*—Welsh & Katz, Ltd.

(57) ABSTRACT

A method for growing a silicon crystal by a Czochralsky method, wherein, let a pulling speed be V (mm/min) and an average value of an in-crystal temperature gradient in a pulling axis direction within a temperature range, a silicon melting point to 1350° C., be G (° C./mm), V/G ranges from 0.16 to 0.18 mm²/° C. min between a crystal center position and a crystal outer periphery position, and a ratio G outer/G center of an average value G of an in-crystal temperature gradient in a pulling axis direction within a temperature range, a silicon melting point to 1350° C., at a crystal outer surface to that at a crystal center is set to up to 1.10 to thereby obtain a high-quality perfect crystal silicon wafer. Such a perfect crystal silicon wafer, wherein an oxygen concentration is controlled to up to $13 \times 10^{17}$ atoms/cm³, an initial heat treatment temperature is at least up to 500° C. and a temperature is raised at up to 1° C./min at least within 700 to 900° C., thereby making uniform a wafer radial distribution to an arbitrary oxygen precipitation density level.

5 Claims, 16 Drawing Sheets

ENTRY TEMPERATURE: 450~600°C
TEMPERATURE RAMPING RATE: 0.5°C/min
ULTIMATE TEMPERATURE: 750°C
HOLDING TIME: 8 HOURS
OXYGEN CONCENTRATION: 11.0e17a/cc

U.S. PATENT DOCUMENTS

| | | | | |
|---|---|---|---|---|
| 4,783,235 | A | * | 11/1988 | Morioka et al. ............... 117/17 |
| 4,944,834 | A | | 7/1990 | Tada et al. |
| 5,308,446 | A | * | 5/1994 | Bihuniak et al. ............. 117/13 |
| 5,827,367 | A | * | 10/1998 | Wijaranakula et al. ..... 117/200 |
| 5,900,059 | A | * | 5/1999 | Shimanuki et al. ......... 117/217 |
| 5,922,127 | A | * | 7/1999 | Luter et al. ................. 117/200 |
| 5,931,662 | A | * | 8/1999 | Adachi et al. ............... 118/500 |
| 5,942,032 | A | * | 8/1999 | Kim et al. .................... 117/13 |
| 5,954,873 | A | * | 9/1999 | Hourai et al. ................. 117/13 |
| 5,968,264 | A | * | 10/1999 | Iida et al. .................... 117/217 |
| 5,997,640 | A | * | 12/1999 | Berthold et al. ............ 117/200 |
| 6,036,776 | A | * | 3/2000 | Kotooka et al. ............ 117/217 |
| 6,153,008 | A | | 11/2000 | Von Ammon et al. |

FOREIGN PATENT DOCUMENTS

| | | | |
|---|---|---|---|
| EP | 0785298 | | 6/2002 |
| JP | 03-279290 | | 12/1991 |
| JP | 05-194076 | | 8/1993 |
| JP | 06097179 A | * | 4/1994 |
| JP | 07-133187 | | 5/1995 |
| JP | 09315882 A | * | 12/1997 |
| JP | 11-092272 A | | 4/1999 |
| WO | WO 98/45507 | | 10/1998 |
| WO | WO 98/45508 | | 10/1998 |

OTHER PUBLICATIONS

Patent Abstracts of Japan. English Translation of JP 09-315882 (1997).*

Patent Abstracts of Japan. English Abstract and Computer translation of JP 06-097179 (1994).*

Nakamura, Kozo et al.: "Formation process of grown-in defects in Czochralski grown silicon crystals" Journal of Crystal Growth 180 (1997) 61-72.

Ammon, Wilfried Von et al.: "The dependence of bulk defects on the axial temperature gradient of silicon crystals during Czochralski growth" 2300 Journal of Crystal Growth 151 Jun. 1, 1995, Nos. 3/4, Amersterdam, NL., pp. 273-277.

Nakamura, Kozo et al.: "Formation process of grown-in defects in Czochralski grown silicon crystals" Journal of Crystal Growth 180(1997)61-72.

Ammon, Wilfried Von et al.: "The dependence of bulk defects on the axial temperature gradient of silicon crystals during Czochralski growth" 2300 Journal of Crystal Growth 151 Jun. 1, 1995, Nos. 3/4, Amersterdam, NL., pp. 273-277.

* cited by examiner

PRODUCTION METHOD FOR SILICON SINGLE CRYSTAL AND PRODUCTION DEVICE FOR SINGLE CRYSTAL INGOT, AND HEAT TREATING METHOD FOR SILICON CRYSTAL WAFER

TECHNICAL FIELD

The present invention relates to a method for producing a silicon single crystal by a Czochralski method, and more particularly to a production method for silicon single crystals to obtain high quality silicon wafers free from grown-in defects.

The present invention also relates to a heat treating method for silicon single crystal wafers, and more particularly to a heat treating method for silicon single crystal wafers concerning perfect crystals fabricated by a Czochralski method.

The present invention also relates to a Czochralski method-based production device for silicon single crystals.

BACKGROUND ART

[CZ Method-Based Single Crystal Ingot Production Device]

A method for pulling a single crystal by a Czochralski method (CZ method) is a known technology, and a CZ method-based single crystal ingot production device is widely used. To obtain a single crystal by a CZ method, a single crystal is pulled out of a melt. Some single crystal ingot production devices, which can pull a single crystal faster by increasing the temperature gradient of a single crystal near the solid-liquid interface, have been proposed (Japanese Patent Application Laid-Open No. 63-256593, Japanese Patent Application Laid-Open No. 8-239291, and U.S. Pat. No. 2,562,245), and have been commercialized.

FIG. 17 is a longitudinal section depicting an example of a conventional single crystal ingot production device. As FIG. 17 shows, the conventional production device 10 comprises a heat shielding element 12 for shielding radiating heat from the liquid level of the melt 15 and the heater 16 surrounding the single crystal ingot 11, and a cooler 13 for cooling the single crystal ingot during pulling (hereafter single crystal pulling ingot). The cooler 13 is disposed to increase the temperature gradient of the single crystal pulling ingot 11 in the axis direction, and is now used for many CZ method-based single crystal ingot production devices to improve the production efficiency of a single crystal ingot by increasing the pulling speed of the ingot 11.

In such a single crystal ingot production device, a so called "hot zone" in the furnace must be disassembled and cleaned before starting the next production step when all the production steps of the ingot complete and the ingot is taken out of the furnace. For an operator to start the disassembly operation, the hot zone must be sufficiently cooled, and for this cooling it normally takes about six hours for a conventional device, which increases the time per production cycle of a single crystal ingot, and drops production efficiency.

[Oxide Precipitate]

In the silicon single crystal produced by a Czochralski method (CZ method), oxygen freed from the crucible is dissolved during crystal growth. The dissolved oxygen in the crystal supersaturates as the crystal cools down, and precipitates during the heat treatment step of the device process, generating oxide precipitates in the silicon wafer. These oxide precipitates negatively affect the leak characteristics near the surface layer, but oxide precipitates which exist in the bulk function as a gettering site, which captures heavy metal, Fe and Cu, etc., which has a negative influence on the device yield. Therefore in a silicon wafer product, it is preferable that oxide precipitates exist moderately in the bulk without existing in the surface layer portion, and functioning as a gettering site of heavy metal.

For this reason, oxide precipitates in the surface layer portion are eliminated by performing hydrogen annealing processing on silicon wafers (Japanese Patent Application Laid-Open No. 61-193456). However, this method alone is insufficient for a quality silicon wafer, and the density of oxide precipitates in the bulk and the uniformity of radial distribution are demanded, which is one of the important characteristics of a silicon wafer.

[Perfect Crystal]

Crystal defects generated during the growth of a CZ silicon single crystal obtained by a Czochralski method (CZ method) negatively affect the reliability of the gate oxide film of an MOS device and on PN junction leak characteristics. Therefore, it is necessary to decrease such crystal defects as much as possible, and conventionally a method of annealing crystals during crystal growth as much as possible has been used (e.g. Japanese Patent Application Laid-Open Nos. 10-152395, 8-12493, 8-337490). With this method, however, the decrease in defects is limited, and defects become huge.

For another approach to decreasing crystal defects, Horai et al proposed a method of eliminating defects by adjusting the relationship between the growth speed of crystals and the temperature gradient in the pulling axis direction to be a ratio in a special range, and reported that perfect crystals (defect free crystals) were obtained, which contain no grown-in defects, by this method (1993, $54^{th}$ Applied Physics Society Academic Lectures (Sep. 27–30, 1993), $54^{th}$ Applied Physics Society Academic Lectures, Preliminary Reports, No. 1, p. 303, 29a-HA-7; Japanese Patent Application Laid-Open No. 8-330316; Japan Crystal Growth Society Journal, Vol. 25, No. 5 (1998), p. 207).

With this method proposed by Horai et al, however, manufacturing to obtain defect free single crystals is extremely difficult depending on the growth conditions. In other words, when producing perfect crystals (defect free crystals) by a method proposed by Horai et al, the relationship between the growth speed of crystals and the temperature gradient in the pulling axis direction must be controlled to be a ratio in an extremely narrow range, which drops the production efficiency. Also, when an ingot of a silicon single crystal is produced setting the conditions to the range proposed by Horai et al, the portion of a perfect crystal (defect free crystal) is relatively small, and in terms of a stable supply of silicon wafers without grown-in defects in the industrial process, this method has the problem of uncertainty.

[Non-Uniformity of Oxide Precipitation in Perfect Crystal]

Generally speaking, a perfect crystal is a crystal where such crystal defects as voids and dislocation clusters do not exist, and a perfect crystal is also called a "defect free crystal". In such a perfect crystal, neither grown-in defects such as voids nor the above mentioned oxide precipitates exist, but oxide precipitate nuclei do exist, so if a perfect crystal silicon wafer sliced from a perfect crystal ingot is heat treated, oxide precipitates are introduced into the wafer.

The reason why oxide precipitates are introduced into a perfect crystal wafer by heat treatment is probably because oxide precipitates are generated in the wafer by the growth of oxide precipitate nuclei along with the heat treatment of the wafer, and in a perfect crystal, the wafer radial distribution of oxide precipitation may be very non-uniform in some cases.

In other words, two zones, that is, a "vacancy dominant zone" where precipitation easily occurs, and an "interstitial silicon dominant zone" where precipitation rarely occurs, exist in a perfect crystal, and if these zones coexist in the wafer plane, the distribution of the oxide precipitation becomes non-uniform. Since the non-uniform distribution of oxide precipitation brings out a negative effect on the yield of the device, it is necessary to solve non-uniformality and to create a uniform status here by using some means.

However, it is almost impossible to adjust the growth conditions of a perfect crystal to solve such non-uniformity because the growth conditions of a perfect crystal are in an extremely narrow range, and manufacturing a perfect crystal where oxide precipitation distribution is uniform is very difficult.

[Prior Art Related to Factors of Non-Uniformity of Oxide Precipitation]

The above mentioned non-uniform distribution of oxide precipitation is probably because the density distribution of point defects, which strongly relates to the generation of oxide precipitate nuclei, is non-uniform. A typical known phenomena of difference in precipitation behavior due to point defect distribution is that vacancy is dominant and oxide precipitation tends to occur in a zone inside the OSF ring, and interstitial silicon is dominant and oxide precipitation rarely occurs in a zone outside the OSF ring.

Kissinger et al reported that the oxide precipitate density becomes uniform in the wafer plane by increasing the temperature of a silicon wafer where the OSF ring exists in the wafer surface (therefore the vacancy dominant zone and interstitial silicon dominant zone coexist) from 500° C. to 1000° C. at a 1° C./min. temperature rise speed, and then performing one hour of heat treatment at 1000° C. (Electrochemical Society Proceedings, Vol. 98-13, p. 158).

This paper, however, does not report on a perfect crystal, and in this case, void defects, due to the coagulation of voids, exist inside the OSF ring, and dislocation clusters, due to the coagulation of interstitial silicon, exist outside the OSF ring, so the method disclosed in this report cannot be directly applied to a perfect crystal. In other words, the report by Kissinger et al is a method which can be applied to a wafer where the vacancy dominant zone and the interstitial silicon dominant zone are clearly separated by the OSF ring, but cannot be directly applied to a perfect crystal where the vacancy dominant zone and the interstitial silicon dominant zone coexist in the wafer plane.

For example, if the heat treatment reported by Kissinger et al is performed on a perfect crystal, and if the oxide density is relatively high, oxide precipitation distribution becomes uniform but precipitates are generated even in the device activation layer zone in the surface layer. If the oxygen density is low, on the other hand, the oxide precipitation distribution in the plane cannot be uniform. And if oxide precipitates are generated even in the device activation layer zone in the surface layer by setting the oxygen density high, this will negatively affect the device yield, and industrial implementation is very difficult. In the case of low oxygen density where the DZ layer (non-oxide precipitation layer on the surface layer) can exist, on the other hand, oxide precipitation distribution cannot be uniform, so it is difficult to apply the heat treatment method reported by Kissinger et al for industrial implementation.

In the Japanese Patent Application Laid-Open No. 8-253392, a method for controlling density at the center of a generating oxide precipitate nuclei in the single crystal silicon is proposed, where a single crystal silicon is annealed at a minimum temperature of about 350° C., the single crystal silicon is heated (or cooled) to a first temperature 1, which is about 350° C.–500° C., during this annealing step, then this temperature is increased from T1 to a second temperature T2, which is about 500° C.–750° C., with an average speed of the temperature increase from T1 to T2, at less than 25° C. per minute, and the annealing is ended when the generation center of the oxide precipitate nuclei can be dissolved at a temperature of less than about 1150° C. According to this method, precipitates with a uniform density can be introduced using samples having different oxygen densities.

This method, however, is to make the oxide precipitate density to within about a 1 digit range (uniforming) by the heat treatment of samples with different oxygen densities, and not for solving the non-uniformity of precipitation due to the difference of point defect distribution generated in the crystal growth stage. Therefore, with this method, it is difficult to achieve a uniformity of oxide precipitation behavior in the diameter direction of crystals or in the plane of the wafer, and it is not possible to stably manufacture wafers having a DZ layer with uniform oxide precipitates. Another problem of this method is that the complicated thermal process takes time and labor, which considerably aggravates the productivity of products.

DISCLOSURE OF THE INVENTION

It is a first object of the present invention to determine further suitable growth conditions to obtain defect free single crystals so that high quality silicon wafers, free from grown-in defects, can be stably supplied.

It is a second object of the present invention to provide a heat treating method for uniforming oxide precipitates in a silicon wafer in a simple process for silicon prefect crystals.

It is a third object of the present invention to provide a production device and a method for single crystal ingots to produce silicon perfect crystals wherein the time required for the production process can be decreased and the production efficiency of silicon perfect crystals can be improved.

[Production Conditions for Perfect Crystals]

To achieve the first object, the present inventors closely studied practical growth conditions, and as a result, suitable growth conditions to obtain defect free single crystals were discovered and the present invention was completed.

The present invention is to obtain high quality silicon wafers free from grown-in defects, and is a method for growing a silicon single crystal by a Czochralski method, characterized in that when the pulling speed is V (mm/min.) and the average value of an in-crystal temperature gradient in a pulling axis direction within a temperature range from a silicon melting point to 1350° C. is G (° C./mm), V/G between a crystal center position and a crystal outer periphery position is 0.16–0.18 $mm^2$/° C. min., and the ratio G outer/G center of an average value G of an in-crystal temperature gradient in a pulling axis direction at a crystal outer surface and the crystal center within a temperature range from a silicon melting point to 1350° C. is 1.10 or less. By this, a silicon single crystal ingot free from grown-in defects, including voids and dislocation clusters, can be obtained, and high quality silicon wafers free from grown-in defects can be obtained by processing the silicon single crystal ingot using a normal method.

This invention is essentially to prevent the generation of grown-in defects by adjusting the growth speed of a silicon single crystal ingot when a silicon single crystal is grown by a Czochralski method. For this, changing each parameter (V, G, V/G, G outer/G center) can be implemented by changing the distance between the heat shielding element equipped in the Czochralski method-based silicon single crystal production device and the silicon melt.

More specifically, the present invention is to provide the following silicon single crystal ingot production method and device, and the silicon single crystal wafers to be obtained from the silicon single crystal ingot produced thereby.

(A1) A method for producing a silicon single crystal ingot under the following conditions (a) and (b). "(a) V/G value from a crystal center position to a crystal outer periphery position=0.16–0.18 mm$^2$/° C. min." and (b) G outer/G center≦1.10".

Here, "V (mm/min.)" is the pulling speed in the Czochralski method, "G (° C./mm)" is the average value of an in-crystal temperature gradient in a pulling axis direction within a temperature range from a silicon melting point (approx. 1412° C.) to 1350° C., "G outer" is the G value on an outer surface of the crystal, and "G center" is the G value at the crystal center. There is no established theory about the silicon melting point, where some sources state that it is 1420° C. However, the specific degree of the silicon melting point poses no problems in the present invention, and "the temperature range from a silicon melting point to 1350° C." is in the scope of the present invention, regardless what the accepted silicon melting point is.

(A2) The above mentioned method for producing a silicon single crystal ingot, characterized in that the above conditions (a) and (b) are adjusted by changing the distance between a heat shielding element equipped in the Czochralski method-based silicon single crystal production device and the silicon melt.

(A3) The above mentioned method for producing a silicon single crystal ingot, characterized in that the above conditions (a) and (b) are adjusted by changing the pulling speed of the silicon single crystal ingot when the silicon single crystal ingot is produced by a Czochralski method.

(A4) A silicon single crystal wafer with decreased grown-in defects, which is obtained from the above mentioned silicon single crystal ingot.

(A5) A silicon perfect single crystal wafer free from grown-in defects, which is obtained from the above mentioned silicon single crystal ingot.

(A6) A method for producing a silicon single crystal ingot, characterized in that the silicon single crystal ingot is produced while adjusting the distance between a heat shielding element equipped in a Czochralski method-based silicon single crystal production device and silicon melt. According to this method, at least the amount of radiating heat and the volume of inactive gas to the silicon single crystal ingot are adjusted, so at least the in-crystal temperature gradient of the silicon single crystal ingot is adjusted.

(A7) A silicon single crystal ingot production device which is a Czochralski method-based silicon single crystal production device, comprising a crucible element which stores silicon melt, rotates and is vertically driven, a pulling element for pulling the silicon single crystal ingot while rotating from the silicon melt, a heating element for heating the crucible, and a heat shielding element for shielding radiating heat from the heating element, in a closed container, characterized in that a drive mechanism for moving the heat shielding element is equipped for changing the in-crystal temperature gradient in the pulling axis direction of the silicon single crystal ingot.

In the method of (A6) and the device of (A7), the adjustment of the amount of radiating heat and volume of inactive gas to the silicon single crystal ingot does not depend on the temperature range, so the in-crystal temperature gradient adjusted by the method of (A6) and the device of (A7) is not limited to the temperature range from a melting point of silicon to 1350° C., and it does not matter whether the in-crystal temperature gradient is a value at the crystal center or on an outer surface of the crystal.

(A8) A method for obtaining an effect equivalent to changing the pulling speed of the silicon single crystal ingot by a Czochralski method by adjusting the distance between a heat shielding element equipped in a Czochralski method-based silicon single crystal production device and the silicon melt.

Adjusting the distance between the heat shielding element and silicon melt and changing the pulling speed of the silicon single crystal ingot can exhibit similar effects, but do not counter each other, so it is possible to change the pulling speed at the same time as adjusting the distance.

[Basic Principle and Phenomena to be a Base of the Present Invention]

FIG. 1 is a conceptual diagram depicting a distribution pattern of defects to be generated in a silicon single crystal ingot which is obtained when the growth speed of the silicon single crystal in a CZ method is constant (in this distribution, "grown-in defects" means defects in a crystal which are normally generated during the growth of a silicon single crystal in a general CZ method, such as an OSF ring, a void defect and a dislocation cluster).

As FIG. 1 shows, when the growth speed of a silicon single crystal is constant, a dislocation cluster is generated at the initial stage of pulling a silicon single crystal ingot, then an OSF ring and void defect are generated. In this case, a defect free zone, where conditions are accidentally satisfied, is generated between a dislocation cluster and OSF ring. Therefore, theoretically, a defect free zone can be expanded if optimum conditions to create a defect free zone are determined, and the silicon single crystal ingot is pulled under these conditions.

[Comparison of Present Invention and Prior Art]

As the "optimum conditions for generating a defect free zone", Horai et al (Japanese Patent Application Laid-Open No. 8-330316) state that "in a temperature range from a silicon melting point to 1300° C., the V/G value=0.20–22 mm$^2$/° C. min. in an area inside the 30 cm position from an outer periphery position of the crystal bulk, and the V/G value=0.20–0.22 mm$^2$/° C. min. or more in an area outside thereof (V/G value is gradually increased towards the outer periphery of the crystal bulk)."

In the present invention, on the other hand, the conditions stated in (1) of the above "means for solving the problem" are presented, and the relationship between the invention by Horai et al (prior art) and the present invention will be described below.

FIG. 2 is a diagram depicting the relationship between the distance from the liquid level of the silicon melt and the in-crystal temperature of a silicon single crystal ingot. In FIG. 2, h indicates the distance (mm) from the liquid level of the silicon melt, and T indicates the in-crystal temperature (° C.) of the silicon single crystal ingot. As FIG. 2 shows, the in-crystal temperature of the silicon single crystal ingot decreases as it becomes distant from the liquid level of the silicon melt when the silicon single crystal ingot is being pulled from the silicon melt. And in FIG. 2, the in-crystal temperature at a location which is h1 away from the liquid level of the silicon melt is 1350° C., and a perfect crystal is obtained by monitoring the in-crystal temperature gradient from the liquid level of the silicon melt to the height h1, which is the attempt of the present invention.

The attempt of the invention by Horai et al, on the other hand, is to obtain a perfect crystal by monitoring the in-crystal temperature gradient up to the height h2, which is above h1, where the temperature is 1300° C., which is lower than the temperature at h1.

In other words, the present invention has an aspect where more appropriate conditions than the optimum conditions presented by Horai et al are presented in the production process of a silicon single crystal ingot. This is obvious in FIG. 3, which shows the relationship between G outer/G center and the in-crystal temperature (° C.), and as FIG. 3 shows, the range of the present invention (the portion shaded with lines slanting to the left) overlap a part of the range presented by Horai et al (portion shaded with lines slanting to the right). So for this overlapped part, the present invention can be a useful selection invention which selects more appropriate conditions from the range of the prior invention.

However, on the other hand, as FIG. 3 also shows, all of the portion shaded with lines slanting to the left is not included in the portion shaded with lines slanting to the right, and the present invention therefore has an aspect where a perfect crystal of silicon is obtained outside the range presented by Horai et al (in other words, in the range where Horai et al did not present). Therefore, the present invention is not completely included in the prior invention by Horai et al, and is not really a selection invention or dependent invention thereof.

This is also obvious in FIG. 4 which shows the relationship between the invention by Horai et al in the V/G value (mm$^2$/° C.·min) and the in-crystal temperature (° C.) (in FIG. 4, the portion A is the range of the present invention, and the portion B is the range of the invention by Horai et al), and in FIG. 5 which shows the relationship between the invention by Horai et al in G outer/G center and V/G value (mm$^2$/° C.·min) (in FIG. 5, the portion A is the range of the present invention, and the portion B is the range of the invention by Horai et al), wherein the ranges of both inventions, fully indicated by these parameters, are completely different.

[Silicon Single Crystal Ingot Production Device]

FIG. 6 is a block diagram depicting the key sections of the silicon single crystal ingot production device in accordance with the present invention. Just like a normal CZ method-based silicon single crystal production device, the silicon single crystal ingot production device in accordance with the present invention comprises a crucible 13 for producing and storing silicon melt 12 (this crucible 13 is the quartz crucible 13b disposed inside a graphite crucible 13a, just like a normal CZ method-based silicon single crystal production device), a heater 14 for heating the crucible 13, an electrode 15 for supplying power to the heater 14, a crucible holder 16 for supporting the crucible 13, and a pedestal 17 for rotating the crucible 13, which are disposed inside the chamber 11 which is a closed container. In the chamber 11, a hear insulation material 21, a melt receiver 23 and inner cylinder 24 are installed. This device also has a heat shielding element 25 for shielding the radiation of heat from the heater 14 to the silicon bulk 27. Also the silicon single crystal ingot production device in accordance with the present invention has an inactive gas supply and exhaust system, which is normally equipped in this type of CZ method-based silicon single crystal production device, although the system is not illustrated here. With this system, the heat shielding element 25 also has the function of adjusting the flow paths of inactive gas.

The silicon single crystal ingot production device in accordance with the present invention is characterized in that the distance h between the tip of the heat shielding element 25 and the liquid level of the silicon melt 12 is adjusted by moving the heat shielding element 25 so as to adjust the V/G value (mm$^2$/° C.·min) and G outer/G center, which is the key point when carrying out the present invention. Actually at the same time of changing the shielded amount of heat from the heater 14 and the liquid level of the silicon melt 12 to the silicon bulk 27 by adjusting the distance h, the volume and speed of the inactive gas, which flows on the surface of the silicon bulk 27, subtly changes, by which the ratio of the in-crystal temperature gradient in the crystal pulling axis direction on the silicon bulk 27 surface and the in-crystal temperature gradient at the center part thereof in the crystal pulling axis direction can be adjusted in the present invention.

In this embodiment, the distance h between the tip of the heat shielding element 25 and the liquid level of the silicon melt 12 is adjusted by interlocking the lifter 25a for adjusting the height of the heat shielding element 25 and the angular 25b for adjusting the inclination of the heat shielding element 25. However, the adjustment of the distance h is not limited by this mechanism. In other words, it should be understood that any mode is included in the scope of the present invention only if the distance h can be adjusted, since the present invention is the first to adjust the V/G value (mm$^2$/° C.·min) and the G outer/G center using the heat shielding element equipped in the CZ method-based silicon single crystal production device.

Also in the present invention, the distance h may be adjusted based on the calculation result in simulation analysis, such as a global heat transfer analysis, or may be adjusted by feedback control based on actually measured values.

[Silicon Single Crystal Wafer]

The silicon single crystal ingot produced by the method or device in accordance with the present invention has a higher certainty in obtaining zones which are free from grown-in defects, and the ratio thereof in quantity is higher than the silicon single crystal ingot obtained by the prior invention by Horai et al. Therefore, a silicon perfect single crystal wafer free from grown-in defects can be obtained at higher quantity and with higher certainty from the silicon single crystal ingot in accordance with the present invention than prior art, and can contribute to a dramatic improvement of IC yields.

The silicon single crystal ingot produced by the method or device in accordance with the present invention is not free from grown-in defects in all portions thereof, but has portions where crystal defects are included. However, at least in general, the ratio of grown-in defects which exist is decreased much more, so even a wafer which is sliced from a portion where grown-in defects exist still exhibits high quality, and this portion can be new wafers in this sense, constituting a part of the present invention related to the claims.

These high quality wafers can be fabricated by slicing the silicon single crystal ingot at a predetermined thickness and performing necessary processing, just like the normal fabrication of wafers.

[Heat Treatment of Perfect Crystal and Conditions Thereof]

To achieve the second object of the present invention, the present inventors closely studied heat treatment conditions in detail, and discovered conditions under which the radial point defect distribution difference generated in a perfect crystal can be uniformed at a relatively low cost while a sufficient DZ layer is secured, and completed the present invention.

In other words, the present invention is for providing a heat treating method for obtaining a silicon wafer having a uniform radial oxide precipitate density, regardless the density distribution of point defects in a perfect crystal.

(B1) A heat treating method for a silicon single crystal wafer related to a perfect crystal produced by a Czochralski method, characterized in that a heat treatment temperature at the initial entry of a silicon single crystal wafer to be the target of the heat treatment is 500° C. or less, and the temperature ramping rate in a temperature range from the heat treatment temperature at initial entry to an ultimate temperature set in the range of "700° C.–900° C." is set to 1° C./min or less.

(B2) A heat treating method for a silicon single crystal wafer related to a perfect crystal produced by a Czochralski method, characterized in that a heat treatment temperature at the initial entry of a silicon single crystal wafer to be the target of the heat treatment is 500° C. or less, and the temperature ramping rate in a temperature range from the heat treatment temperature at initial entry to an ultimate temperature set in the range of "700° C.–900° C." is set to 1° C./min or less so as to uniform the distribution of the oxide precipitate density of the silicon single crystal wafer after heat treatment.

(B3) A heat treating method for a silicon single crystal wafer related to a perfect crystal produced by a Czochralski method, characterized in that the heat treatment temperature at the initial entry of a silicon single crystal wafer to be the target of heat treatment and the temperature ramping rate from the heat treatment temperature at initial entry to an ultimate temperature set in the range of "700° C.–900° C." are adjusted so as to adjust the distribution of the oxide precipitate density of the silicon single crystal wafer after heat treatment.

(B4) The method according to (B1), characterized in that the oxygen concentration of the perfect crystal is $13 \times 10^{17}$ atoms/cm$^3$ or less.

(B5) A silicon single crystal wafer produced by the method according to (B4). For perfect crystals which oxygen concentration is $13 \times 10^{17}$ atoms/cm$^3$ or less, oxide precipitates are uniformed between the vacancy dominant zone and the interstitial silicon dominant zone, and a good DZ layer is formed without allowing the oxide precipitates to appear on the wafer surface, so this is superb as a silicon wafer.

[Single Crystal Ingot Production Device for Improving Production Efficiency of Perfect Crystal]

To achieve the third object, the present inventors closely studied and discovered that power consumption is decreased and production time is decreased by moving the cooler equipped in the single crystal ingot production device to an appropriate location according to the production process of the single crystal ingot, and this method is particularly effective for producing a perfect crystal which normally takes a long time to produce, and completed the present invention.

More specifically, the present invention provides the following devices and methods.

(C1) A method for controlling a Czochralski method— (hereafter CZ method) based single crystal ingot production device comprising a cooler for cooling a predetermined location of a single crystal ingot being pulled from the melt (hereafter single crystal pulling ingot), characterized in that when the tail of a single crystal pulling ingot is formed, the power consumption of the single crystal ingot production device is decreased by moving the cooler away from the solid-liquid interface between the single crystal ingot and the melt.

By this, a crucible which can still be heated dispite cooling by the cooler is unnecessary when the tail is created, so power consumption can be decreased.

[Tail of Single Crystal Ingot]

In the production of a single crystal ingot by the CZ method, the inverted cone shaped tapered portion, generally called the tail, must be formed after growing the single crystal to a desired length. If the single crystal pulling ingot is suddenly pulled out of the melt, crystal dislocation, called a slip dislocation (slip back), is generated in the ingot, and this portion cannot be used as a product.

Here, slip back is generated at a location in the ingot for the length of a diameter of a portion distant from the melt surface, so to obtain as many wafers as possible which are appropriate as a product from the ingot, in the process up to the end of pulling, and the tail must be formed by carefully tapering the diameter of the ingot in the process up to the end of pulling, so that slip back is not generated in a portion processed to be a wafer (hereafter body).

To form a tail, the tail is normally formed to be about the length of the diameter of the body. Because, if the tail is too short, an abnormal oxide precipitation part touches the body, and that portion cannot be used as a product, but a tail which is too long is not economical, since the tail cannot be used as a wafer.

It is well known in this industry that a single crystal ingot is pulled with a low temperature gradient in the axis direction of the single crystal ingot, in order to form the tail. And for this, the temperature gradient of the single crystal pulling ingot has been decreased by increasing the temperature of the melt by heating the crucible for more than a sufficient time when the tail is formed.

However, if the temperature gradient of the single crystal pulling ingot is intentionally set high using a cooler, in particular, the melt must be heated to a higher temperature. For this heating, power consumption increases, which is not economical, and also the quartz crucible is abnormally heated by this heating, bubbles existing in the crucible expand and pop, and the pieces thereof attach to crystals causing dislocation, or become polycrystals.

Also to heat the crucible which can still be heated despite cooling by the cooler, enormous power must be supplied, which makes the power supply device large, and components in a furnace exposed to excessive heat deteriorate quickly.

With the single crystal ingot production device according to the present invention, however, all of these problems will be solved.

(C2) A method for controlling a Czochralski method— (hereafter CZ method) based single crystal ingot production device where a single crystal ingot is pulled from melt in a heated crucible, comprising a cooler in a furnace for cooling a predetermined location of the single crystal ingot being pulled, characterized in that the production time of a single crystal ingot is decreased by moving the cooler and the crucible for which heating is over closer after pulling the single crystal ingot from the melt.

Here "moving the cooler and the crucible for which heating is over closer" means coring close to the heater, which is the heat source of the CZ method-based single crystal ingot production device, and cooling down. And "moving the cooler and the crucible for which heating is over closer" can be implemented by raising the crucible toward the cooler, or by lowering the cooler toward the crucible, or by a combination of both operations.

(C3) A Czochralski method—(hereafter CZ method) based single crystal ingot production device, comprising a cooler in a furnace for cooling a predetermined location of a single crystal ingot being pulled from melt in a heated crucible (hereafter a single crystal pulling ingot), characterized in that the cooler is raised to move the cooler away from the solid-liquid interface between the single crystal ingot and the melt when a tail of the single crystal pulling ingot is created.

(C4) A Czochralski method—(hereafter CZ method) based single crystal ingot production device comprising a cooler in a furnace for cooling a predetermined location of a single crystal ingot being pulled from the melt in a heated crucible, characterized in that the cooler is lowered to cool the crucible for which heating is over after pulling the single crystal ingot from the melt.

(C5) The above mentioned CZ method-based single crystal ingot production device, characterized in that the cooler is lowered to inside the crucible.

(C6) A Czochralski method—(hereafter CZ method) based single crystal ingot production device comprising a cooler in a furnace for cooling a predetermined location of a single crystal ingot being pulled from melt in a heated crucible, characterized in that the crucible is raised to cool the crucible by moving the cooler and the crucible for which heating is over closer after pulling the single crystal ingot out of the melt.

(C7) A Czochralski method—(hereafter CZ method) based single crystal ingot production device comprising a cooler in a furnace for cooling a predetermined location of a single crystal ingot being pulled from melt in a heated crucible (hereafter single crystal pulling ingot), characterized in that when a tail of the single crystal pulling ingot is created, the cooler is raised to move the cooler away from the solid-liquid interface between the single crystal ingot and the melt, and the cooler is also lowered to cool the crucible for which heating is over after pulling the single crystal ingot out of the melt.

(C8) A method for producing a single crystal ingot using a Czochralski method—(hereafter CZ method) based single crystal ingot production device comprising a cooler in a furnace for cooling a predetermined location of a single crystal ingot being pulled from melt in a heated crucible (hereafter single crystal pulling ingot), characterized in that the size of the diameter of the single crystal pulling ingot is adjusted by changing the distance of the cooler from the solid-liquid interface between the single crystal ingot and the melt.

In other words, the cooler not only greatly contributes to the adjustment of the temperature gradient in the pulling direction at the predetermined location of the single crystal pulling ingot, but also greatly influences the state of the single crystal pulling ingot at the solid-liquid interface. In the above method, if the distance between the cooler and the solid-liquid interface is decreased, the state at the solid-liquid interface moves toward solidification, and the diameter of the ingot to be pulled increases. On the other hand, if the distance between the cooler and the solid-liquid interface is increased, the state at the solid-liquid interface moves to liquefaction, and the diameter of the ingot to be pulled is decreased.

[Application to Perfect Crystal]

The devices and methods according to (C1)–(C8) are suitable for producing a perfect crystal. To produce a perfect crystal, the pulling speed of the single crystal ingot must be decreased and the temperature must be closely monitored, so the pulling time of the single crystal ingot becomes longer, and the production process becomes longer accordingly. However, according to the devices and methods of the present invention (devices and methods according to (C1)–(C8)), time can be decreased in steps other than the pulling step of the single crystal ingot, so a prolonging of the production time is prevented in the production steps in general, and the production of a perfect crystal can be more efficient.

[Operation of Single Crystal Ingot Production Device]

A mode of the single crystal ingot production device according to the present invention is where the distance between the cooler and the surface of the melt can be changed by monitoring whether the diameter of the single crystal pulling ingot is decreased at a desired ratio when the tail of the single crystal pulling ingot is formed, so that the diameter of the single crystal pulling ingot is gradually decreased.

Control for this is generally performed by a so called feedback control. More specifically, the size of the actual diameter is measured, the size of the assumed diameter and the measured value are compared, and if different, the pulling conditions are changed so as to guide (automatically control) processing, in order to obtain the desired diameter. Therefore if the above operation is performed using a feedback system when forming the tail, a tail with the desired length and angle can be formed.

The raised cooler is automatically controlled to be lowered again to the predetermined position or to a position below the predetermined position to cool the hot zone after the pulling of the single crystal pulling ingot is over, so that the hot zone can be force-cooled by lowering the cooler which was raised during the creation of the tail to the bottom part of the furnace after pulling is over.

[Definition of Terms]

In this description, a "perfect crystal" means a single crystal ingot free from grown-in defects (defects in a crystal which are normally generated during growth of a silicon single crystal in a general CZ method, such as an OSF ring, void defect, and dislocation cluster).

In this description, an "ingot" means a single crystal grown from the silicon melt, and "bulk" means a portion inside the wafer sliced from an ingot, and is the concept to distinguish from the surface layer where devices are created. In other words, "bulk" normally refers to inside the wafer, which is several tens of μm or deeper from the surface, but in this description, "bulk" means the portion inside other than the surface layer, such as the DZ layer.

"DZ layer" means a zone with low oxygen completely free from oxide precipitation, which is formed near the surface of the wafer by performing an appropriate heat treatment (e.g. several tens of hours at 1050° C. in a nitrogen atmosphere) to a silicon wafer manufactured by a CZ method. The "DZ layer" is also called the defect-free zone, but in this description, the term "defect free zone" is not used for the DZ layer as a rule, in order to avoid confusion with the defect free zone of a silicon ingot related to a perfect crystal. The DZ layer can also be obtained by hydrogen annealing (Japanese Patent Application Laid-Open No. 61-193456).

In a perfect crystal, a "vacancy dominant zone" generally appears in a certain range at the inner diameter side of the wafer, and the "interstitial silicon dominant zone" generally appears in a certain range at the outer diameter side of the wafer.

The methods and devices according to the present invention (devices and methods according to (C1)–(C8)) can be applied to the CZ method in general, since there are no factors which are influenced by the type of single crystal ingot to be pulled, so a single crystal ingot to be pulled is not limited to the silicon single crystal ingot.

In this description, "temperature gradient" means the degree of temperature change in the vertical axis of the single crystal ingot being pulled from the crucible. Here, "temperature gradient is high (or large)" means that the change of temperature is sharp, and "temperature gradient is low (or small)" means that the change of temperature is mild.

In this description, "hot zone" means the portion which is heated by the heater in the furnace of the single crystal ingot production device (mostly in the block lower than the heat shielding element).

BEST MODE FOR CARRYING OUT THE INVENTION

<Study on Production Conditions of Perfect Crystal>

Embodiment A1

We studied growth conditions to obtain perfect crystals using various growth conditions. Table A1 shows the result. Experiments were performed using a crystal which diameter is 200 mm. The distribution of crystal defects can be studied by observing the surface of the crystal after soaking the crystal in etchant, but in this embodiment, the distribution of defects was studied by performing non-stirring Secco etching for voids and dislocation clusters, and by performing light etching after oxidizing heat treatment for three hours at 780° C., then for 16 hours at 1000° C. for OSF. The in-crystal temperature gradient in the pulling axis direction at each location in the radius direction was determined by a global heat-transfer analysis in the growth device currently established.

Table A1 shows the range of the growth speed where a perfect crystal was obtained under each growth condition. Here the conditions where the range of growth speed is not indicated are conditions under which defect free zones were generated only at a part in the plane of the crystal.

TABLE A1

| Temperature gradient in axis direction | | | Puling speed | | | |
|---|---|---|---|---|---|---|
| Crystal center G center (° C./mm) | Crystal outer peripheral G outer (° C./mm) | G outer/G center | when perfect crystal was obtained (mm/min) | V/G center (mm2/° C. min) | V/G edge (mm2/° C. min) | |
| 2.304 | 2.258 | 0.98 | 0.38~0.40 | 0.165~0.174 | 0.168~0.177 | Range |
| 2.320 | 2.343 | 1.01 | 0.39~0.41 | 0.168~0.177 | 0.166~0.175 | of |
| 2.502 | 2.627 | 1.05 | 0.42~0.44 | 0.168~0.176 | 0.160~0.164 | present |
| 2.600 | 2.808 | 1.08 | 0.45~0.46 | 0.173~0.177 | 0.160~0.164 | inven- |
| 2.411 | 2.652 | 1.10 | 0.425~0.43 | 0.176~0.178 | 0.160~0.162 | tion |
| 2.921 | 3.359 | 1.15 | X | | | |
| 2.706 | 3.383 | 1.25 | X | | | |

TABLE A1-continued

| Temperature gradient in axis direction | | | Pulling speed | | |
|---|---|---|---|---|---|
| Crystal center G center (° C./mm) | Crystal outer peripheral G outer (° C./mm) | G outer/G center | when perfect crystal was obtained (mm/min) | V/G center (mm2/° C. min) | V/G edge (mm2/° C. min) |
| 2.750 | 3.575 | 1.30 | X | | |
| 2.720 | 3.944 | 1.45 | X | | |
| 3.012 | 4.819 | 1.60 | X | | |

As Table A1 shows, a perfect crystal is obtained only when G outer/G center, which is a ratio of the average G of the in-crystal temperature gradient in the pulling axis direction at the outer surface of the crystal and at the crystal center in the temperature range from a melting point of the silicon to 1350° C., is 1.10 or less.

Also a perfect crystal is obtained when the pulling speed V (mm/min) is in the range where V/G is 0.16–0.18 mm$^2$/° C.·min when G outer/G center is 1.10 or less.

Embodiment A2

Figure 1:
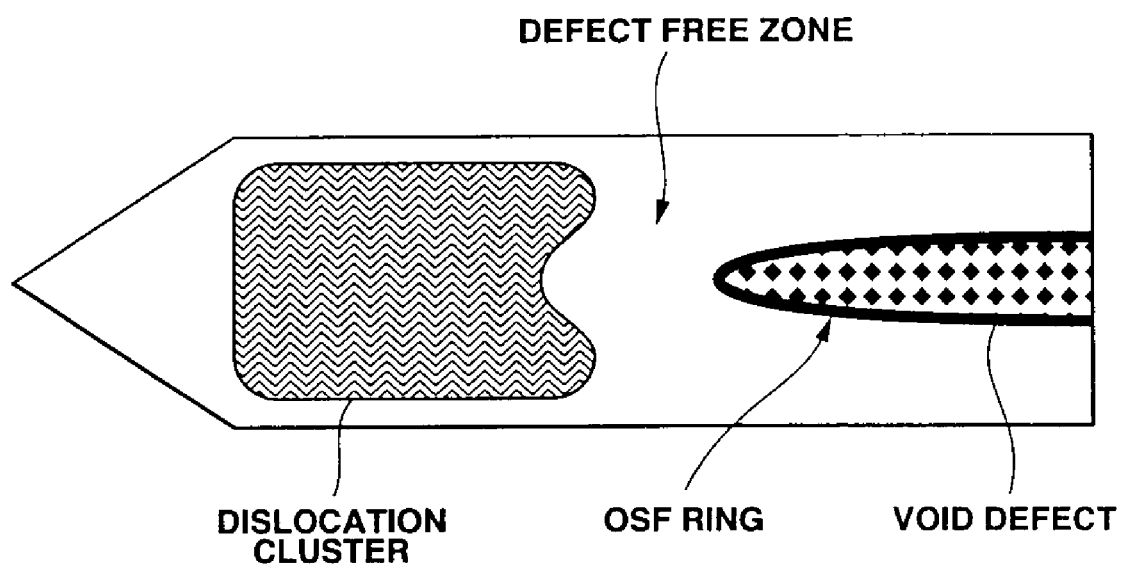
FIG. 1 is a conceptual diagram depicting a distribution pattern of defects generated in a silicon single crystal ingot which is obtained when a growth speed of the silicon single crystal by a CZ method is constant.
Figure 2:
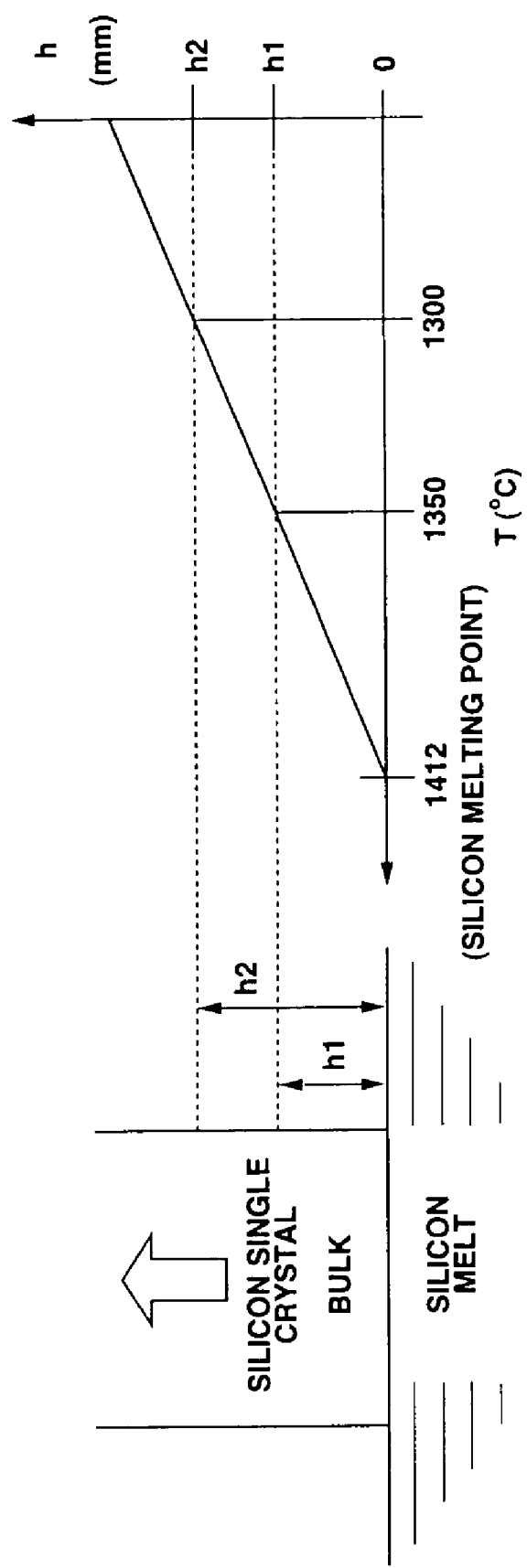
FIG. 2 is a diagram depicting the relationship between a distance from the liquid level of silicon melt and the in-crystal temperature of a silicon single crystal ingot.
Figure 3:
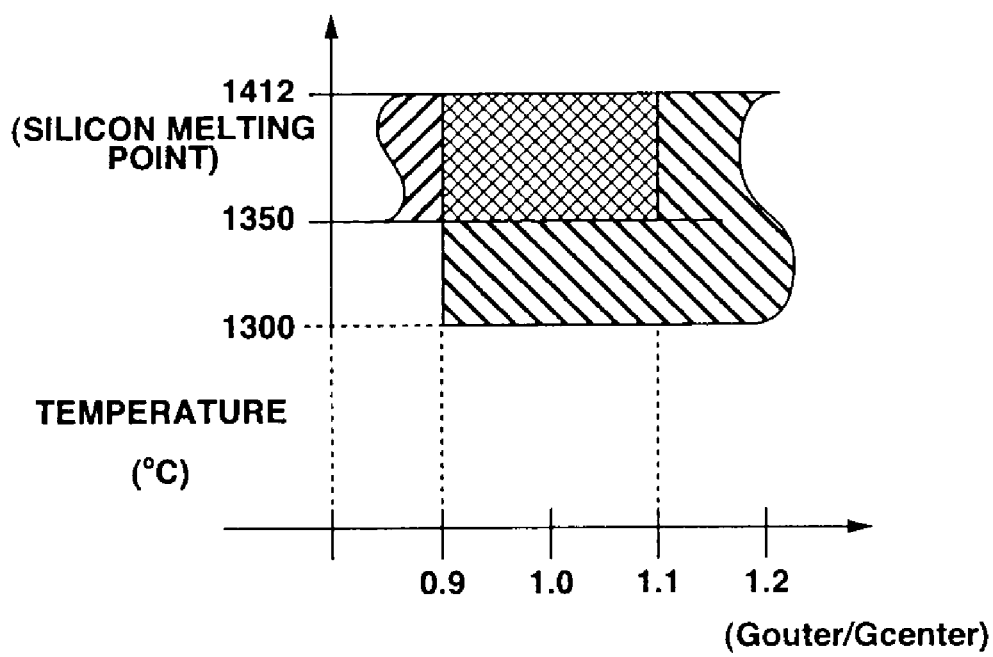
FIG. 3 is a diagram depicting a range of the present invention and a range of a prior art defined by the relationship between G outer/G center and the in-crystal temperature (° C.)
Figure 4:
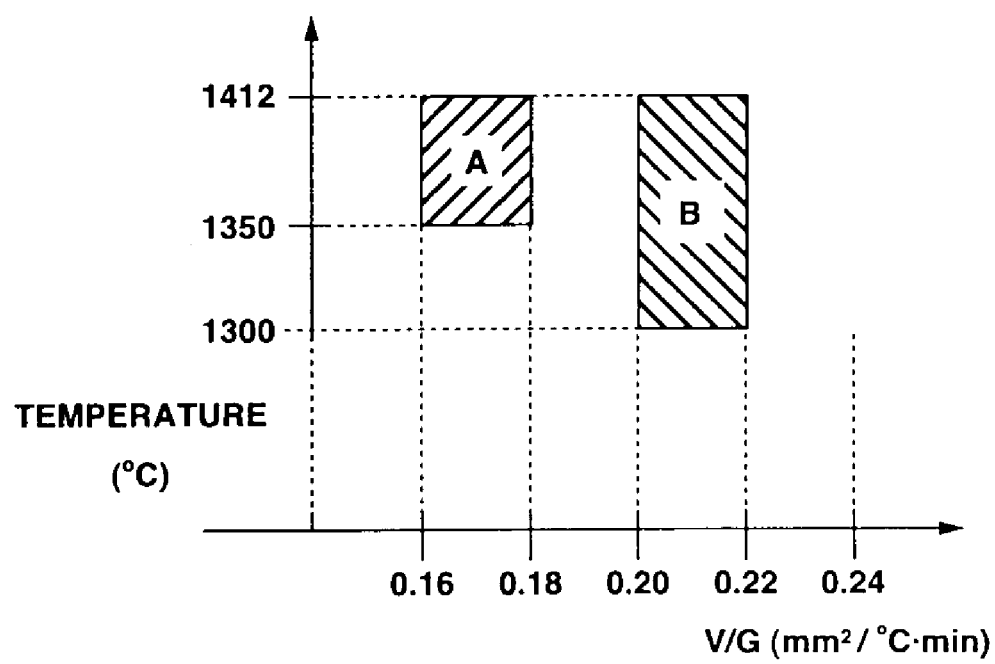
FIG. 4 is a diagram depicting a range of the present invention and a range of a prior art defined by the relationship between V/G value ($mm^2/°$ C.·min) and the in-crystal temperature (° C.)
Figure 5:
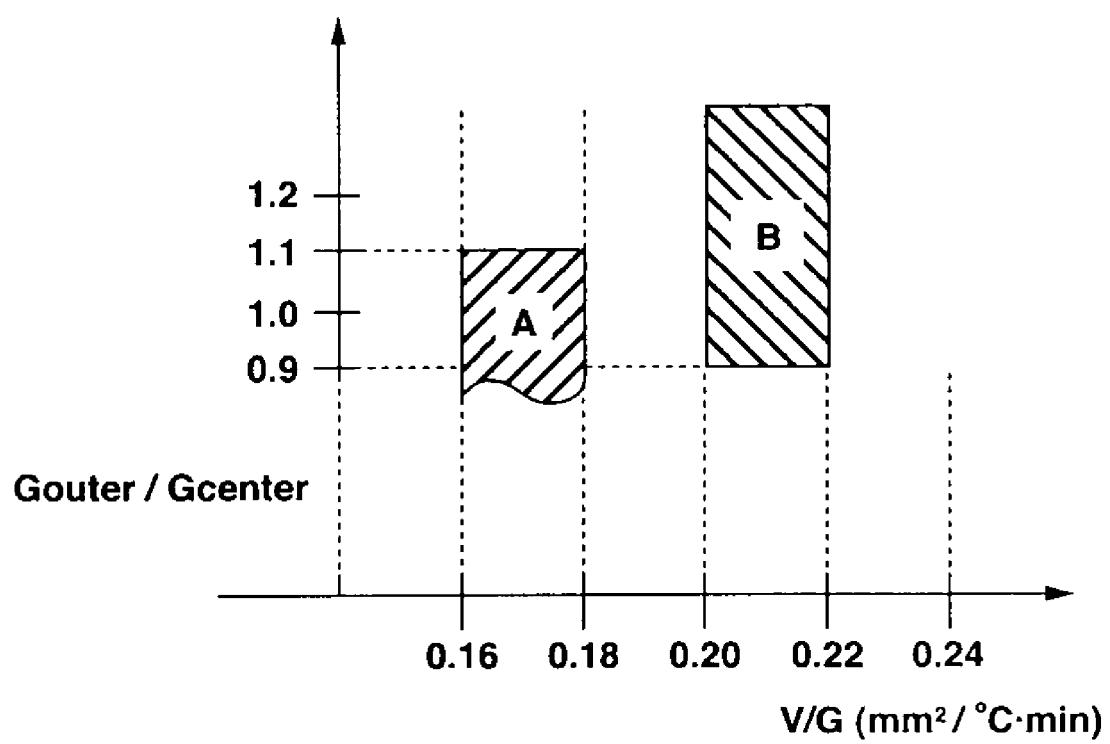
FIG. 5 is a diagram depicting a range of the present invention and a range of a prior art defined by the relationship between G outer/G center and V/G value ($mm^2/°$ C.·min)
Figure 6:
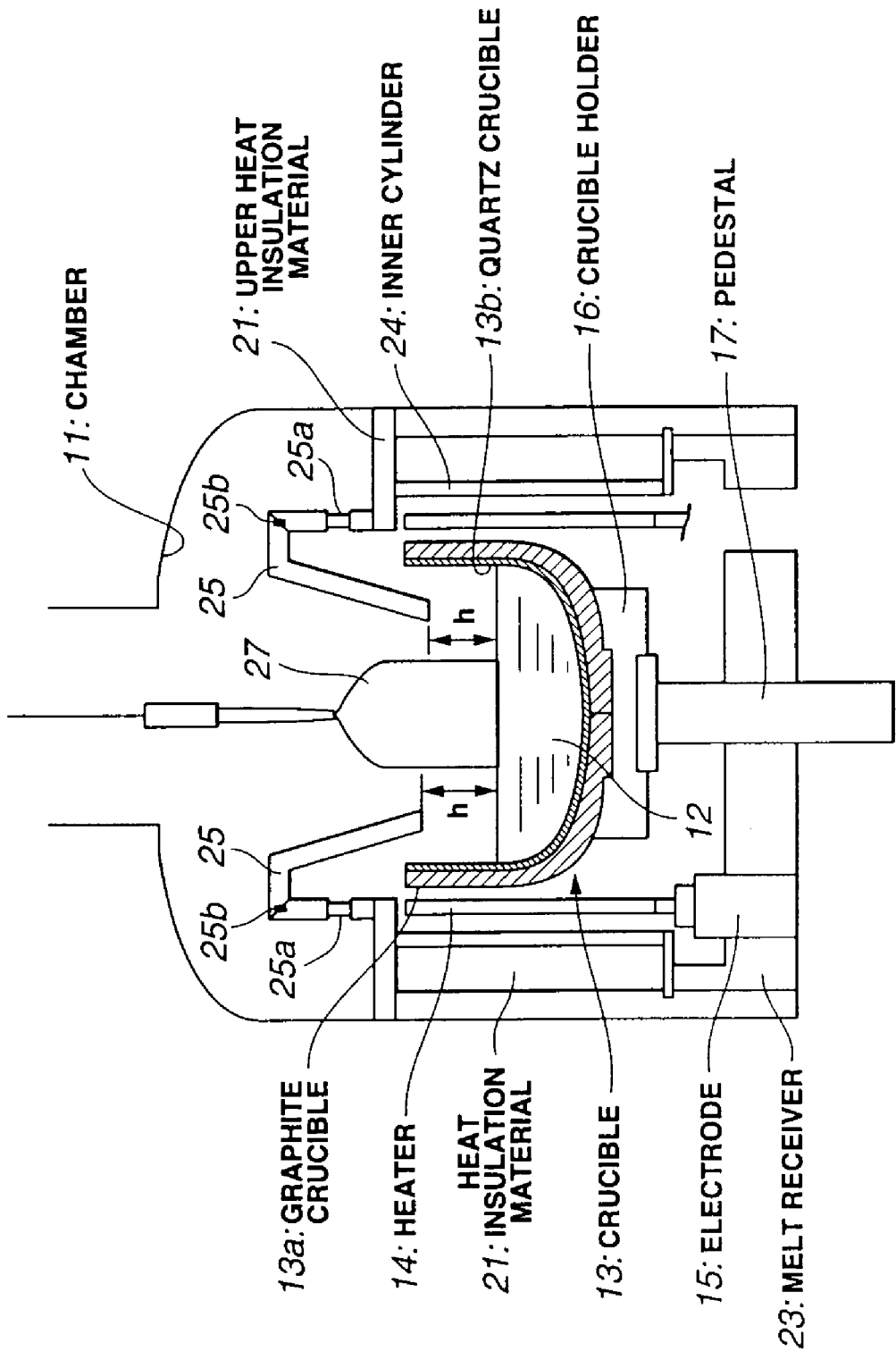
FIG. 6 is a block diagram depicting the key sections of a silicon single crystal ingot production device according to the present invention.

When a crystal is grown at a constant pulling speed under the growth conditions determined in Table A1, the growth conditions may gradually be deviated from the optimum growth conditions because of the change of the in-crystal temperature gradient during growth. If this state is left alone, a crystal ingot, which is deviated from the defect free growth conditions, as shown in the conceptual diagram in FIG. 1, is produced, so it is necessary to guide the conditions to be optimum by making appropriate changes.

In the embodiment A2, the pulling speed is changed to guide the conditions to be optimum in such a case. And as Table A2 shows, a perfect crystal was obtained by changing the pulling speed V following up with the change of the length of the crystal.

TABLE A2

| | | predetermined conditions of pulling speed | | | Present invention | | |
|---|---|---|---|---|---|---|---|
| Crystal length (mm) | G1 center (° C./mm) | Pulling speed (mm/min) | V/G center (mm2/° C. min) | Existence of defects | Pulling speed (mm/min) | V/G center (mm2/° C. min) | Existence of defects |
| 0 | 2.786 | 0.43 | 0.154 | Yes | 0.43 | 0.154 | Yes |
| 100 | 2.72 | 0.43 | 0.158 | Yes | 0.43 | 0.158 | Yes |
| 200 | 2.643 | 0.43 | 0.163 | Yes | 0.43 | 0.163 | Yes |
| 300 | 2.561 | 0.43 | 0.168 | No | 0.43 | 0.168 | No |
| 400 | 2.502 | 0.43 | 0.172 | No | 0.43 | 0.172 | No |
| 500 | 2.412 | 0.43 | 0.178 | Yes | 0.42 | 0.174 | No |
| 600 | 2.358 | 0.43 | 0.182 | Yes | 0.41 | 0.174 | No |
| 700 | 2.291 | 0.43 | 0.188 | Yes | 0.4 | 0.175 | No |
| 800 | 2.218 | 0.43 | 0.194 | Yes | 0.39 | 0.176 | No |
| 900 | 2.159 | 0.43 | 0.199 | Yes | 0.38 | 0.176 | No |
| 1000 | 2.115 | 0.43 | 0.203 | Yes | 0.37 | 0.175 | No |

Embodiment A3

This embodiment is for indicating that a perfect crystal can be obtained by changing the distance between the silicon melt and the heat shielding element when the conditions are gradually deviated from the optimum growth conditions because of the change of the in-crystal temperature gradient during growth, in the same way as the embodiment A2 (Table A3).

TABLE A3

| | | Predetermined conditions on distance between Si melt and heat shielding element | | | | Present invention | | | |
|---|---|---|---|---|---|---|---|---|---|
| Crystal length (mm) | Pulling speed (mm/min) | Distance between Si melt and heat shielding element (mm) | G1 center (° C./mm) | V/G center (mm2/° C. min) | Existence of defects | Distance between Si melt and heat shielding element (mm) | G1 center (° C./mm) | V/G center (mm2/° C. min) | Existence of defects |
| 0 | 0.43 | 70 | 2.786 | 0.154 | Yes | 70 | 2.786 | 0.154 | Yes |
| 100 | 0.43 | 70 | 2.72 | 0.158 | Yes | 70 | 2.72 | 0.158 | Yes |
| 200 | 0.43 | 70 | 2.643 | 0.163 | Yes | 70 | 2.643 | 0.163 | Yes |

TABLE A3-continued

| | | Predetermined conditions on distance between Si melt and heat shielding element | | | | Present invention | | | |
|---|---|---|---|---|---|---|---|---|---|
| Crystal length (mm) | Pulling speed (mm/min) | Distance between Si melt and heat shielding element (mm) | G1 center (° C./mm) | V/G center (mm2/° C. min) | Existence of defects | Distance between Si melt and heat shielding element (mm) | G1 center (° C./mm) | V/G center (mm2/° C. min) | Existence of defects |
| 300 | 0.43 | 70 | 2.561 | 0.168 | No | 70 | 2.561 | 0.168 | No |
| 400 | 0.43 | 70 | 2.502 | 0.172 | No | 70 | 2.502 | 0.172 | No |
| 500 | 0.43 | 70 | 2.412 | 0.178 | Yes | 68 | 2.443 | 0.176 | No |
| 600 | 0.43 | 70 | 2.358 | 0.182 | Yes | 66 | 2.486 | 0.173 | No |
| 700 | 0.43 | 70 | 2.291 | 0.188 | Yes | 64 | 2.544 | 0.169 | No |
| 800 | 0.43 | 70 | 2.218 | 0.194 | Yes | 62 | 2.515 | 0.171 | No |
| 900 | 0.43 | 70 | 2.159 | 0.199 | Yes | 60 | 2.515 | 0.171 | No |
| 1000 | 0.43 | 70 | 2.115 | 0.203 | Yes | 58 | 2.500 | 0.172 | No |

As Table A 3 shows, a perfect crystal was obtained by changing the distance between the silicon melt and the heat shielding element following up with the change of the length of the crystal under a predetermined condition of the pulling speed. As the embodiment A3 shows, the same effect as when the pulling speed is changed (Embodiment A2) can be obtained if the distance between the silicon melt and the heat shielding element is changed. Therefore, in terms of obtaining a perfect crystal, it is clear that changing the distance between the silicon melt and the heat shielding element in the silicon single crystal ingot production device generates an effect equivalent to changing the pulling speed.

<Heat Treatment of Perfect Crystal Silicon Wafer>

Figure 7:
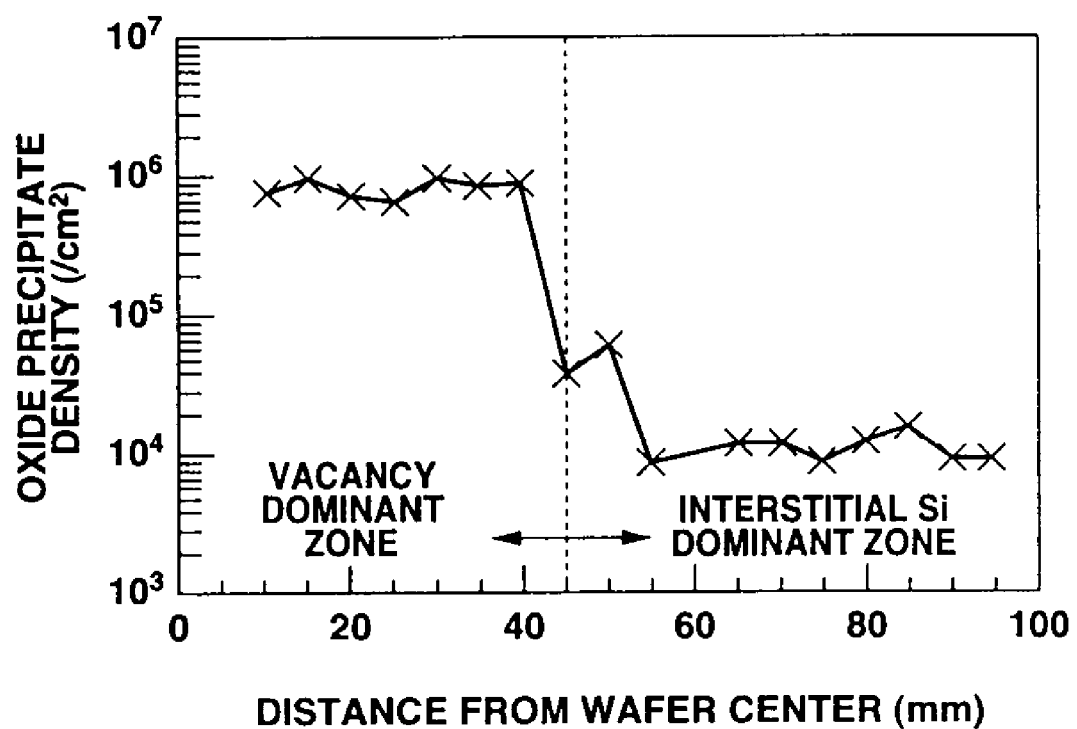
FIG. 7 is a diagram depicting the radial distribution of the oxide precipitate density of a reference sample when only a simulation heat treatment is performed on a silicon wafer which is sliced from a perfect crystal where a vacancy dominant zone with oxygen concentration $14 \times 10^{17}$ atoms/$cm^3$ and an interstitial silicon dominant zone coexist in the plane.

We performed various heat treatments on a silicon wafer sliced from a perfect crystal where the vacancy dominant zone and the interstitial silicon dominant zone coexist in a plane, and we studied the oxide precipitate density distribution in the wafer plane. For an experiment, a boron doped P-type crystal with a 200 mm diameter where the oxygen concentration is $11$–$14 \times 10^{17}$ atoms/cm$^3$ ('79 ASTM) was used, and after performing pre-heat treatment in a nitrogen and oxygen mixed gas atmosphere, a device simulation heat treatment (780° C.×3 h+1000° C.×16 h) in two steps was performed in an oxidizing atmosphere, and the oxide precipitate density was studied by a Wright etching method. FIG. 7 and Table B1 show these results.

FIG. 7 shows the radial distribution of the oxide precipitate density of a reference sample for which only simulation heat treatment is performed on the silicon wafer sliced from a perfect crystal, where the oxygen concentration is $14 \times 10^{17}$ atoms/cm$^3$ and the vacancy dominant zone and the interstitial silicon dominant zone coexist in the wafer plane. Table B1 shows each pre-heat treatment condition, the wafer radial uniformity of the oxide precipitate density, and the existence of the DZ layer.

TABLE B1

| Start temperature (° C.) | Temperature ramping rate (° C./min) | Ultimate temperature (° C.) | Holding time (hours) | Oxygen conc. (xE17a/cm3) | Evaluation of radial uniformity of oxide precipitate density | Existence of DZ layer |
|---|---|---|---|---|---|---|
| 350 | 0.5 | 750 | 4 | 11.0 | ○ | ○ |
| 450 | ↑ | ↑ | ↑ | ↑ | ○ | ○ |
| 500 | ↑ | ↑ | ↑ | ↑ | ○ | ○ |
| 550 | ↑ | ↑ | ↑ | ↑ | X | — |
| 600 | ↑ | ↑ | ↑ | ↑ | X | — |
| 500 | 1.0 | 650 | 1 | ↑ | X | — |
| ↑ | ↑ | ↑ | 4 | ↑ | X | — |
| ↑ | ↑ | ↑ | 8 | ↑ | X | — |
| ↑ | ↑ | ↑ | 16 | ↑ | X | — |
| ↑ | ↑ | 700 | 1 | 10.0 | ○ | ○ |
| ↑ | ↑ | ↑ | ↑ | 11.0 | ○ | ○ |
| ↑ | ↑ | ↑ | ↑ | 12.0 | ○ | ○ |
| ↑ | ↑ | ↑ | ↑ | 13.0 | ○ | ○ |
| ↑ | ↑ | ↑ | ↑ | 14.0 | ○ | X |
| ↑ | ↑ | ↑ | 4 | 11.0 | ○ | ○ |
| ↑ | ↑ | ↑ | 8 | ↑ | ○ | ○ |
| ↑ | ↑ | 750 | 1 | ↑ | ○ | ○ |
| ↑ | ↑ | ↑ | 4 | ↑ | ○ | ○ |
| ↑ | ↑ | ↑ | 8 | ↑ | ○ | ○ |
| ↑ | ↑ | 800 | 1 | ↑ | ○ | ○ |
| ↑ | ↑ | ↑ | 4 | ↑ | ○ | ○ |
| ↑ | ↑ | ↑ | 8 | ↑ | ○ | ○ |
| ↑ | ↑ | 900 | 1 | 11.0 | ○ | ○ |
| ↑ | ↑ | ↑ | ↑ | 14.0 | ○ | ○ |
| | | 1000 | ↑ | 11.0 | X | — |
| ↑ | ↑ | ↑ | ↑ | 14.0 | ○ | X |
| ↑ | 1.5 | 650 | 4 | ↑ | X | — |
| ↑ | ↑ | 700 | ↑ | ↑ | X | — |

TABLE B1-continued

| Start temperature (° C.) | Temperature ramping rate (° C./min) | Ultimate temperature (° C.) | Holding time (hours) | Oxygen conc. (xE17a/cm3) | Evaluation of radial uniformity of oxide precipitate density | Existence of DZ layer |
|---|---|---|---|---|---|---|
| ↑ | ↑ | 750 | ↑ | ↑ | X | — |
| ↑ | ↑ | 800 | ↑ | ↑ | X | — |
| ↑ | 1.25 | 650 | ↑ | ↑ | X | — |
| ↑ | ↑ | 700 | ↑ | ↑ | X | — |
| ↑ | ↑ | 750 | ↑ | ↑ | X | — |
| ↑ | ↑ | 800 | ↑ | ↑ | X | — |
| ↑ | 0.75 | 650 | ↑ | ↑ | X | — |
| ↑ | ↑ | 700 | ↑ | ↑ | ○ | ○ |
| ↑ | ↑ | 750 | ↑ | ↑ | ○ | ○ |
| ↑ | ↑ | 800 | ↑ | ↑ | ○ | ○ |
| ↑ | 0.5 | 650 | 0 | ↑ | X | — |
| ↑ | ↑ | 700 | ↑ | ↑ | ○ | ○ |
| ↑ | ↑ | 750 | ↑ | ↑ | ○ | ○ |
| ↑ | ↑ | 800 | ↑ | ↑ | ○ | ○ |

As Table B1 shows, by rising the temperature to at least 700° C.–900° C. at a speed of 1° C./min or less when the oxygen concentration of a crystal is $13 \times 10^{17}$ atoms/cm$^3$ or less and the initial entry heat treatment temperature is at least about 500° C. or less, the radial distribution of the oxide precipitate density after simulation heat treatment can be uniformed without losing the DZ layer. Within the range of these conditions, oxide precipitates which match the device process can be introduced by adjusting the oxygen concentration of the crystal, the initial entry temperature, the temperature ramping rate, the ultimate temperature and the holding time at the ultimate temperature appropriately.

Embodiment B1

Figure 8:
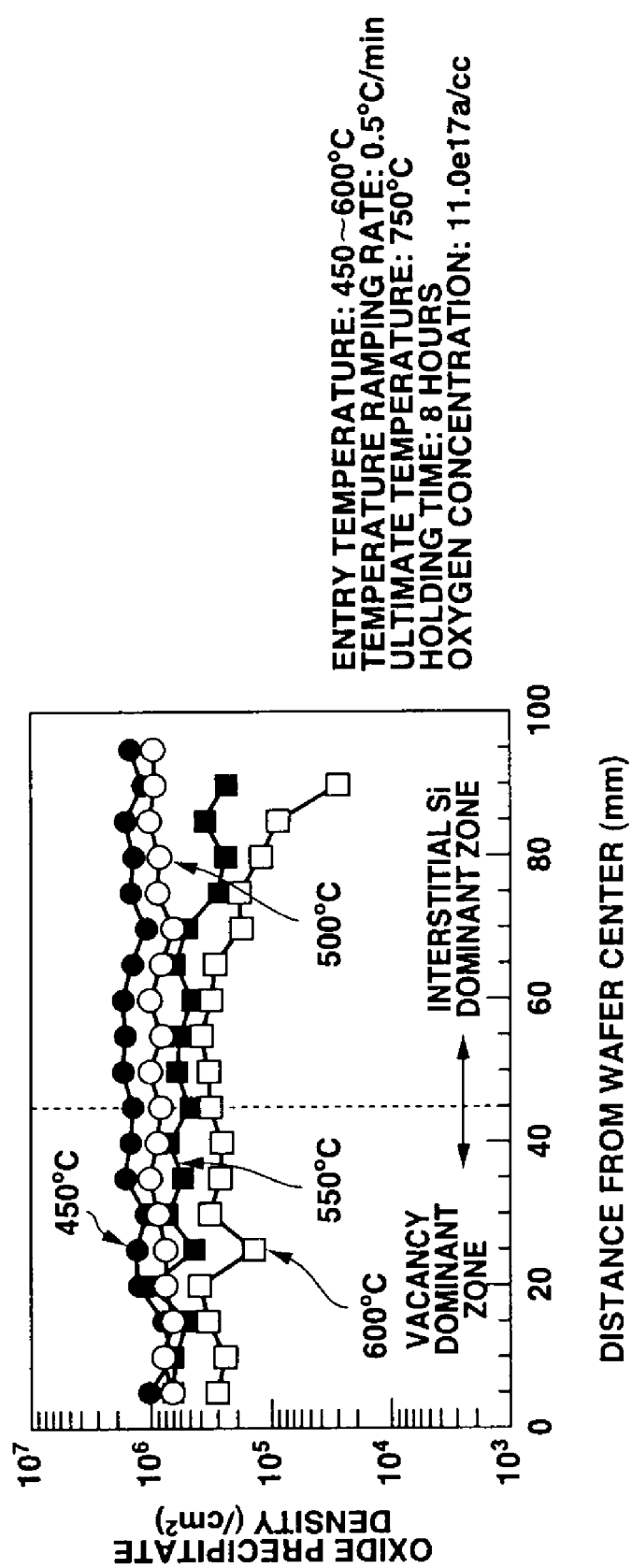
FIG. 8 is a diagram depicting the radial distribution of oxide precipitate density when the entry temperature is changed at 450–600° C., the temperature is raised to 750° C. at a 0.5° C./min speed, 750° C.×4 hours of isothermal processing is performed, and then simulation heat treatment is performed.

FIG. 8 shows the radial distribution of the oxygen precipitate density when simulation heat treatment is performed after the entry temperature is changed to 450° C.–600° C., the temperature is increased to 750° C. at a speed of 0.5° C./min, and 750° C.×4 hours of isothermal processing is performed. As FIG. 8 shows, the precipitate density is uniformed when the entry temperature is 500° C. or less.

Embodiment B2

Figure 9:
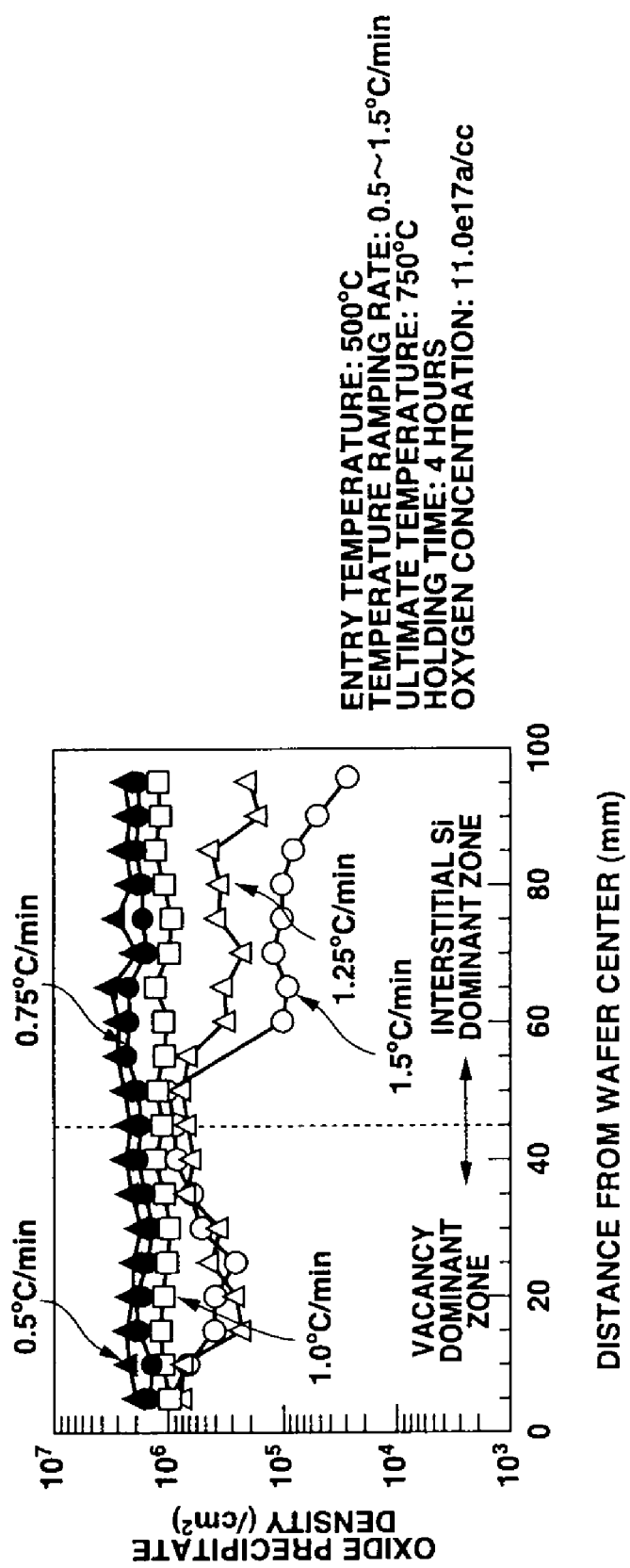
FIG. 9 is a diagram depicting the radial distribution of oxide precipitate density when the 500° C. entry temperature is increased to a 750° C. ultimate temperature at a temperature ramping rate of 0.5–1.5° C./min, isothermal processing is performed for four hours at the ultimate temperature, then simulation heat treatment is performed.

FIG. 9 shows the radial distribution of the oxygen precipitate density when simulation heat treatment is performed after four hours of isothermal processing is performed at the ultimate temperature when the temperature ramping rate from the entry temperature at 500° C. to the ultimate temperature at 750° C. is 0.5–1.5° C./min. As FIG. 9 shows, the precipitate density is uniformed when the temperature ramping rate is 1.0° C./min or less.

Embodiment B3

Figure 10:
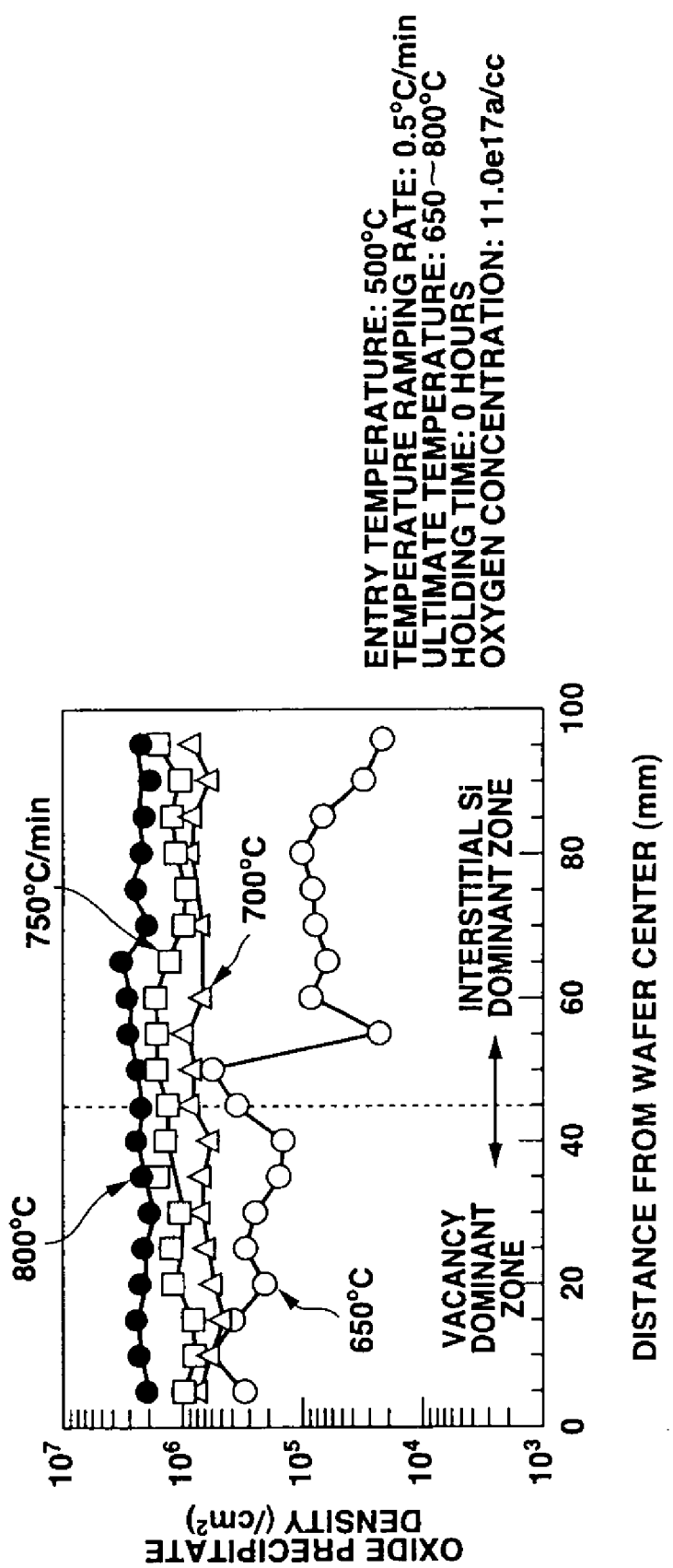
FIG. 10 is a diagram depicting the radial distribution of oxide precipitate density when the 500° C. entry temperature is increased at a 0.5° C./min speed, the ultimate temperature is changed at 650–800° C., then simulation heat treatment is performed.

FIG. 10 shows the radial distribution of the oxygen precipitate density when simulation heat treatment is performed after the temperature is increased from the 500° C. entry temperature at 0.5° C./min speed and the ultimate temperature is changed at 650–800° C. As FIG. 10 shows, the precipitate density is uniformed when the ultimate temperature is 700° C. or more.

Embodiment B4

Figure 11:
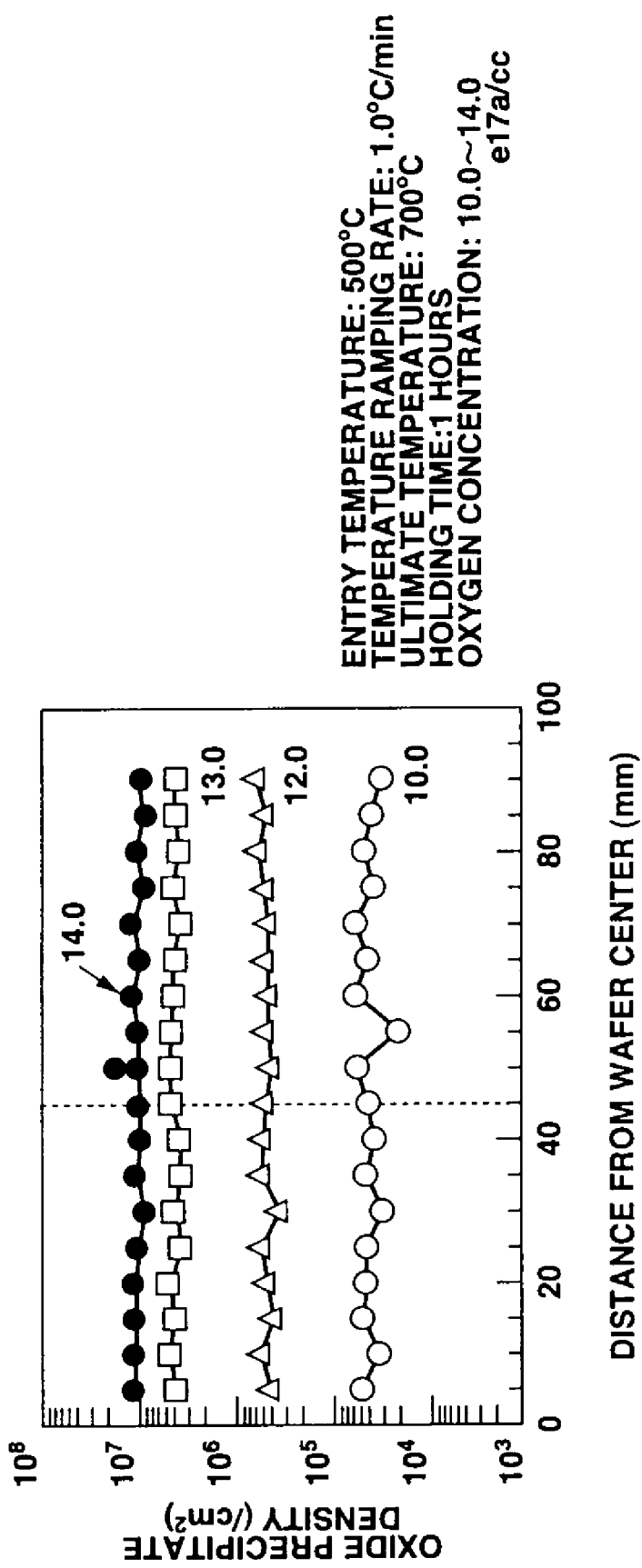
FIG. 11 is a diagram depicting the radial distribution of oxide precipitate density when the 500° C. entry temperature is increased to 700° C. at a 1.0° C./min speed, and oxygen density in the crystal is changed under 700° C.×1 hour of isothermal processing conditions.

FIG. 11 shows the radial distribution of the oxygen precipitate density when the entry temperature is 500° C. and is increased to 700° C. at a 1.0° C./min speed, and the oxygen concentration in the crystal is changed under the isothermal processing of 700° C.×1 hour. As FIG. 11 shows, the radial distribution uniformity of the oxide precipitate density is maintained regardless the oxygen concentration. However, when the oxygen concentration exceeds $13 \times 10^{17}$ atoms/cm$^3$, oxygen precipitates appear on the surface of the wafer, and the DZ layer is not present.

As this result shows, in a silicon wafer where the vacancy dominant zone and the interstitial silicon dominant zone coexist in the plane, any density of oxide precipitates can be introduced uniformly in the plane of the wafer by controlling the oxygen concentration in the crystal in the range of $13 \times 10^{17}$ atoms/cm$^3$ or less, and performing heat treatment according to the present invention.

<Preferred Embodiment of Silicon Single Crystal Ingot Production Device>

Figure 12:
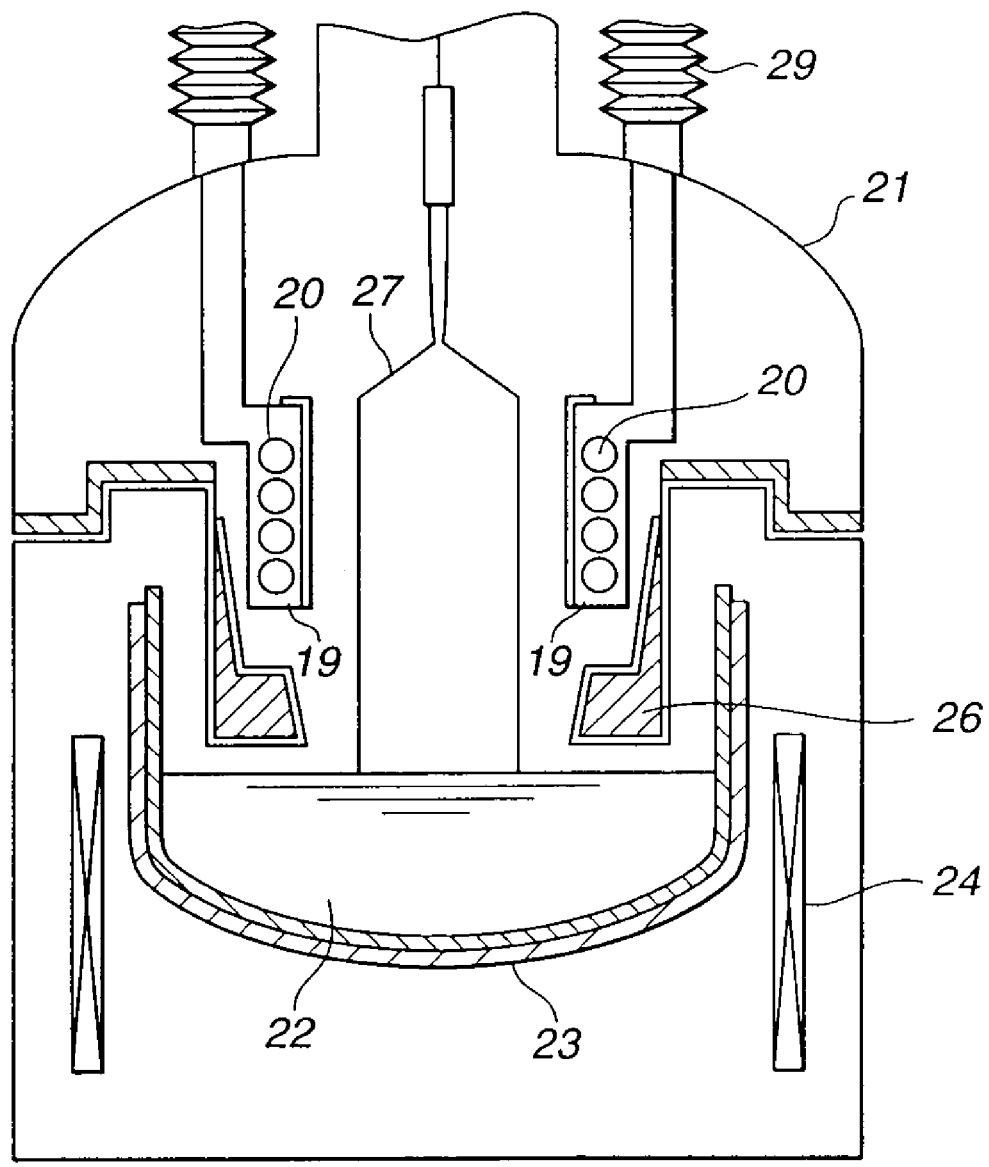
FIG. 12 is a longitudinal section depicting a single crystal ingot production device according to the present invention.

FIG. 12 is a longitudinal section depicting a preferred embodiment of a silicon single crystal ingot production device according to the present invention. An embodiment of the silicon single crystal ingot production device according to the present invention will now be described with reference to FIG. 12.

[General Configuration]

The silicon single crystal ingot production device according to the present invention comprises a crucible 23 for producing and storing the silicon melt 22 and a heater 24 for heating the crucible 23 in a chamber 21, which is a closed container, just like a conventional CZ method-based silicon single crystal ingot production device. An electrode for supplying power to the heater 24, a crucible holder for supporting the crucible 23, a pedestal for rotating the crucible 23, a crucible elevating device for raising/lowering the crucible, a hear insulation material, a melt receiver, and an inner cylinder are also attached to the silicon single crystal ingot production device, just like a normal CZ method-based silicon single crystal ingot production device, but these are not illustrated to simplify the drawing. In this device, a heat shielding element 28 for shielding the radiation of heat from the silicon melt 22 and the heater 24 to the silicon ingot 27, and a cooler 19, which is disposed inside the heat shielding element 28, are equipped.

The silicon single crystal ingot production device according to the present invention further comprises an inactive gas supply and exhaust system, which is normally equipped in this type of CZ method-based silicon single crystal ingot production device, although this is not illustrated. Under such a system, the heat shielding element 28 also has the function of adjusting the flow paths of the inactive gas.

[Cooler]

The silicon single crystal ingot production device according to the present invention is characterized in that the cooler 19 comprised of pipes in which cooling water runs is installed so as to be freely raised/lowered inside the heat shielding element 28. In this embodiment, the cooler 19 has a spiral-shaped built-in cooling water pipe 20 in a cylindrical part surrounding the single crystal ingot being pulled, and can be raised/lowered in the axis direction of the ingot by the cooler elevating device (not illustrated) installed outside the chamber 21 (see Japanese Patent Application Laid-Open No. 9-275097). The mechanical means for implementing such an elevating device is ball screws and a rod, for example, but is not limited to this.

Cooling water runs in the cooler 19 comprised of pipes, and the cooling water is supplied via a supply pipe (not illustrated). At a location where supply/drain pipes, including this supply pipe, penetrate into the chamber 21, a bellows element 29 is attached, so as to maintain air tightness and flexibility. During forming the body, the cooler 19 is secured at a same location to adjust the temperature gradient at a predetermined location, which is strongly related to the optimal generation of crystal defects.

[Forming a Tail]

Figure 13:
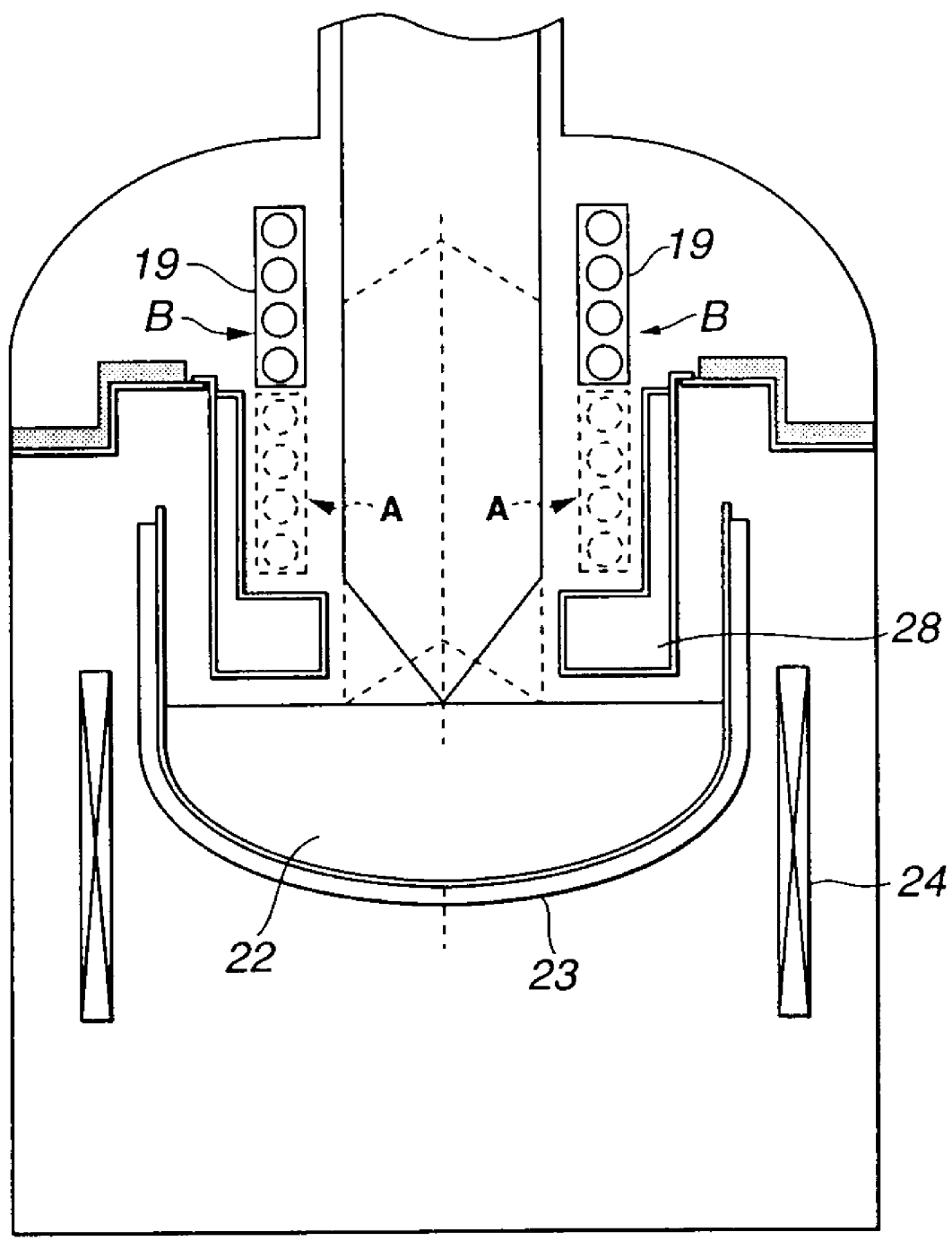
FIG. 13 is a longitudinal section depicting the operation of the single crystal ingot production device according to the present invention.

Now the tail formation process using the single crystal ingot production device according to the present invention will be described with reference to FIG. 13. To simplify the drawing, elements which are not directly related to the description of the present invention are not illustrated.

As mentioned above, the cooler 19 is secured at a position (A in FIG. 13) which provides a desired temperature gradient to a predetermined location of the single crystal pulling ingot during the formation of the body. When shifting to the tail formation process, the cooler 19 is pulled to the position B. By this, the distance between the cooler 19 and the melt surface increases, and as a result, the diameter of the ingot being pulled is gradually tapered.

Here, when pulling the cooler 19 to the position B, it is preferable to pull it gradually, that is, not pulling it all at once. Because if the distance from the surface of the melt to the cooler 19 is suddenly increased, the heat history of the body changes, and such problems as generating abnormal oxide precipitation areas at two locations occur.

The above process can be executed by an operator operating the device while directly monitoring, but normally this is performed by automatic control.

[Operation Flow of Tail Formation]

Figure 14:
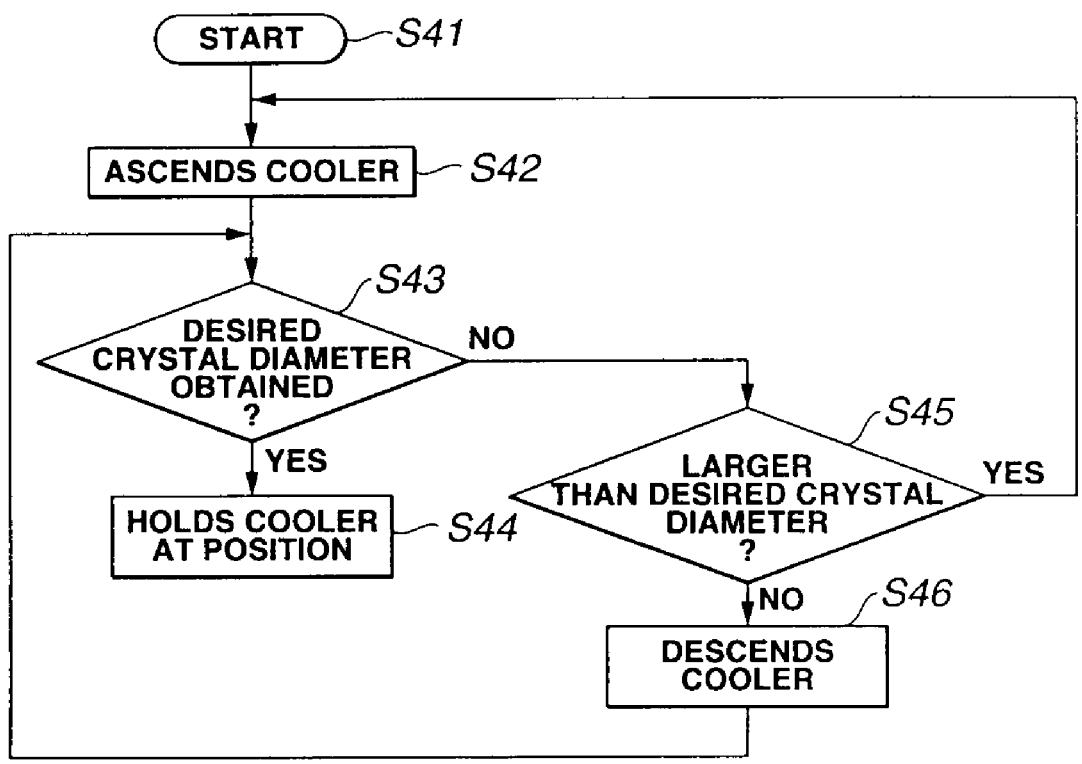
FIG. 14 is a flow chart depicting the control process of the single crystal ingot production device according to the present invention.

FIG. 14 is a flow chart depicting the process of the automatic control of feedback, which can be applied to the present invention. Now the control flow will be described with reference to FIG. 14.

When the formation of a tail starts (S41), the cooler elevating mechanism is activated, and the cooler 19 is raised for a predetermined amount (S42). Then the crystal diameter of the ingot is compared with a desired size (S43). If the desired crystal diameter has been obtained as a result of this comparison, the cooler 19 is held at that position (S44). However, if the desired crystal diameter has not been obtained, it is judged whether the actually detected crystal diameter is larger or smaller than the desired crystal diameter (S45). If the actual crystal diameter is larger than the desired value, the process returns to S42, where the cooler 19 is further raised, then the same process is repeated.

If the actually detected crystal diameter is smaller than desired value, the cooler 19 is lowered for a required amount (S46). Then the control process returns to S43, where the actual crystal diameter and the desired crystal diameter are compared.

By repeating the above control process, the tail of the crystal ingot which matches the provided conditions can be formed. In the above embodiment, the cooler 19 is raised/lowered by the elevating device, but another method for increasing the distance between the surface of the melt and the cooler 19, that is, raising/lowering the crucible 23 may be used, or raising/lowering the cooler 19 and raising/lowering the crucible may be combined. Here the crucible 23 is raised/lowered by the crucible elevating device, which is not illustrated, so the crucible 23 can be freely raised/lowered by operating the crucible elevating device. The elevating device, which is not illustrated, may be operated by an operator, or may be operated by the above mentioned automatic control feedback method. This is the same for the case when the raising/lowering of the cooler 19 and the raising/lowering of the crucible 23 are combined.

[Results]

Figure 15:
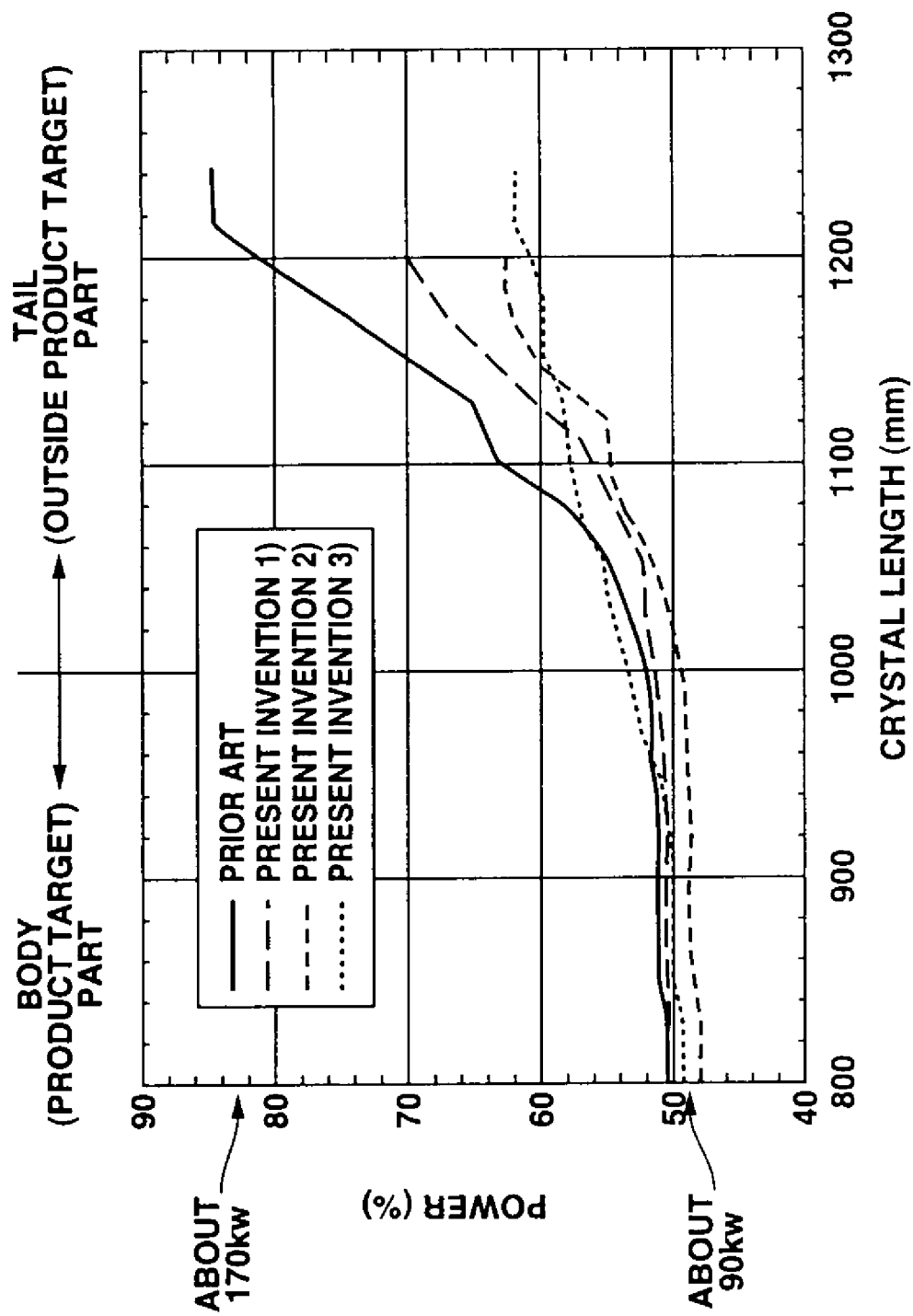
FIG. 15 is a graph depicting the result of applying the control method for the single crystal ingot production device according to the present invention.

FIG. 15 and Table C1 show the results when the cooler 19 is moved away from the solid-liquid interface between the single crystal ingot and the melt by 1) raising the cooler 19 by the cooler elevating device, 2) lowering the crucible 23 by the crucible elevating device, or 3) performing both 1) and 2).

TABLE C1

|  | Number of ingots pulled | Number of ingots dislocated at tail | Number of graphite crucible used |
| --- | --- | --- | --- |
| Prior art | 20 | 12 | 2 |
| Present invention 1) | 20 | 3 | 1 |
| Present invention 2) | 20 | 0 | 1 |
| Present invention 3) | 20 | 1 | 1 |

As FIG. 15 shows, when a method according to the present invention is executed, power consumption can be dramatically decreased compared with prior art. As Table C1 shows, when a method according to the present invention is applied, the number of ingots where dislocation occurred to a tail can be decreased, so the single crystallization ratio improves. At the same time, since overheating can be prevented as power consumption decreases, the load applied on a graphite crucible can be decreased, therefore the number of graphite crucibles to be used is decreased when the same number of single crystal are pulled, which is economical.

[Force-Cooling of Hot Zone]

Now the force-cooling of the hot zone using the cooler 19 after pulling the single crystal ingot will be described.

Figure 16:
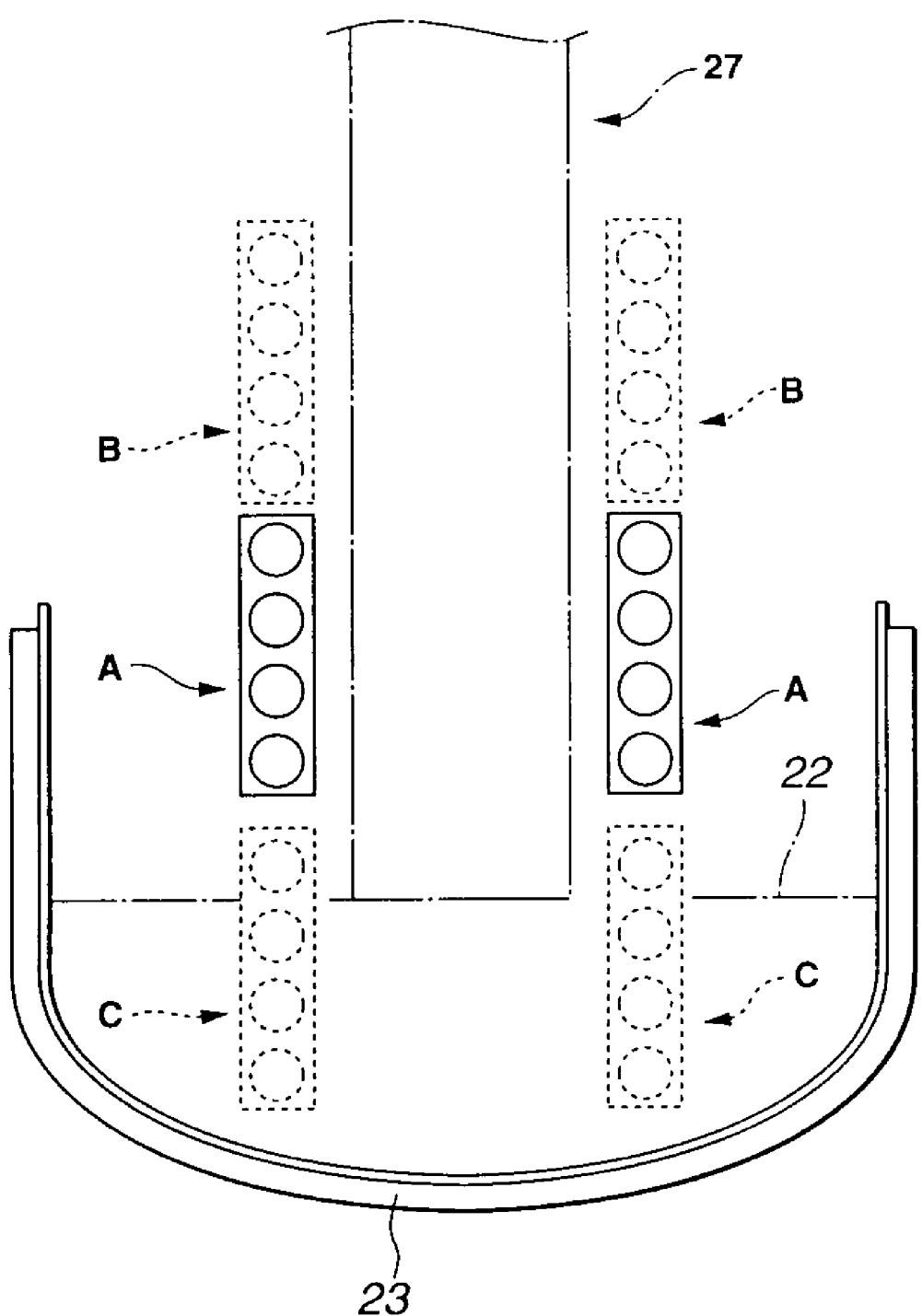
FIG. 16 is a block diagram depicting the force-cooling of the hot zone.
Figure 17:
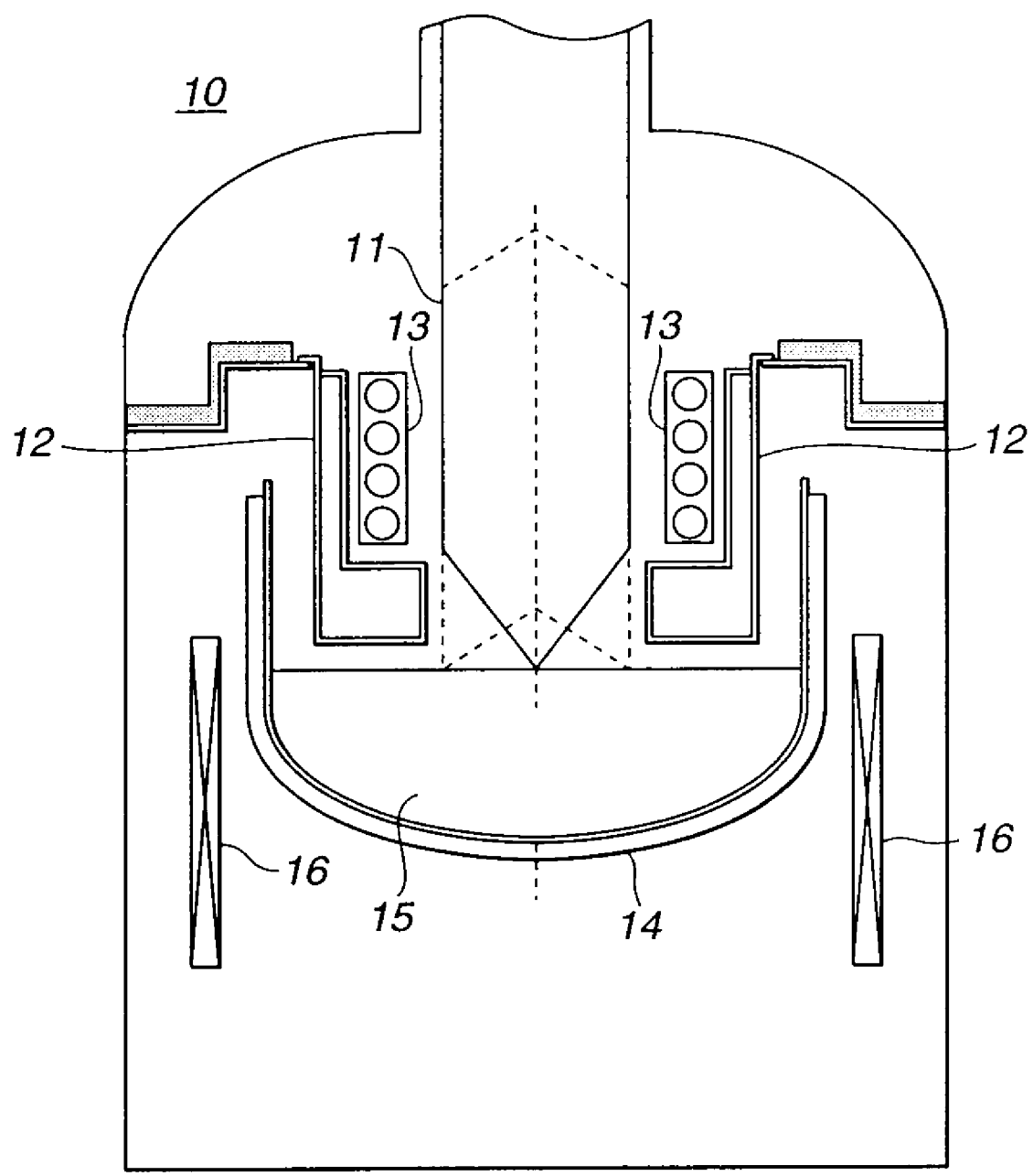
FIG. 17 is a longitudinal section depicting a conventional single crystal ingot production device.

When the formation of a tail ends, the single crystal ingot production process completes. Here, in the present invention, the cooler 19, which has been raised, is lowered again toward the crucible 23 after the formation of the tail ends, as shown in FIG. 16 (C in FIG. 16), so as to force-cool the hot zone, including the crucible 23. By this, the transition time to the next production step can be decreased, and the overall production cycle can be decreased.

Since the crucible 23 has the highest heat of the in-furnace components in the hot zone, it is preferable to promote the cooling of the crucible by moving the cooler 19 to the crucible as closely as possible. If the heat shielding element 28 interferes with the lowering of the cooler 19 at this time, it may be structured such that the heat shielding element 28 is lowered together, or the heat shielding element 28 can be moved to the outside direction of the furnace, so that the cooler 19 can pass through.

INDUSTRIAL APPLICABILITY

According to the method or device of the present invention, a silicon single crystal ingot, which has much perfect region free from grown-in defects, can be stably produced compared with prior art. Therefore a large volume of silicon prefect single crystal wafers free from grown-in defects can be supplied without fail, and ultimately the yield of IC products can be dramatically improved.

According to the present invention, in a silicon wafer where a vacancy dominant zone and an interstitial silicon dominant zone coexist in the plane, wafer radial distribution can be uniformed to any oxide precipitate density by increasing the temperature from approximately 700° C. to 900° C. at a 1° C./min or less speed when the oxygen concentration is controlled to be $13 \times 10^{17}$ atoms/cm$^3$ or less, and the initial entry heat treatment temperature is approximately 500° C. or less.

Therefore according to the present invention, in a silicon wafer where a vacancy dominant zone and an interstitial silicon dominant zone coexist in the plane, a silicon single crystal wafer where the wafer radial distribution of oxide precipitate density is uniformed can be obtained, so a high quality silicon wafer suitable for a device process can be produced.

Also, the single crystal ingot production device, the control method thereof, and the production method for a single crystal ingot according to the present invention can stabilize the pulling of a single crystal and decrease the power consumption when the tail of the single crystal ingot is formed. Also, the calories to be applied during the forming of a tail can be decreased, so the load on the in-furnace components, including the crucible, can be decreased and the life of the components can be extended. Also, the single crystal ingot production device and the control method thereof according to the present invention decrease the cooling time of the hot zones after the single crystal ingot is produced, and the single crystal ingot production cycle can be decreased (for more efficiency). These effects are extremely preferable in terms of improving perfect crystal production efficiency.

The invention claimed is:

1. A heat treating method consisting of the steps of distributing oxide precipitates in a silicon single crystal wafer by a first step of maintaining a first heat treatment temperature for an initial entry of the silicon single crystal wafer up to 500° C., and a second step of maintaining a temperature ramping rate in a temperature range from the first heat treatment temperature to a second heat treatment temperature of 700° C.–900° C., said ramping rate being 1° C./min or less, said first step being performed first after a wafer slicing process, said wafer comprising a surface region of up to several tens of μm deep from a wafer surface and a bulk region of several tens or more of μm deep from the wafer surface, said wafer having been prepared from a crystal free from grown-in defects and produced by a Czochralski method, said oxide precipitates being uniformly distributed in the bulk region.

2. The method according to claim 1, wherein the oxygen concentration of the perfect crystal is $13 \times 10^{17}$ atoms/cm$^3$ or less.

3. A silicon single crystal wafer produced by the method according to claim 2.

4. A heat treating method consisting of the steps of distributing oxide precipitates in a silicon single crystal wafer, by a first step of maintaining a first heat treatment temperature for an initial entry of the silicon single crystal wafer up to said 500° C., and a second step of maintaining a temperature ramping rate in a temperature range from the first heat treatment temperature to a second heat treatment temperature of 700° C.–900° C., said ramping rate being 1° C./min or less, so as to make uniform the distribution of an oxide precipitate density of the silicon single crystal wafer in the wafer, said first step being performed first after a wafer slicing process, said wafer comprising a surface region of up to several tens of μm deep from a wafer surface and a bulk region of several tens or more of μm deep from the wafer surface, said wafer having been prepared from a crystal free from grown-in defects and produced by a Czochralski method, said oxide precipitates being uniformly distributed in the bulk region.

5. A heat treating method consisting of the steps of distributing oxide precipitates in a silicon single crystal wafer, by a first step of controlling a first heat treatment temperature for an initial entry of the silicon single crystal wafer to be a target of the heat treatment and a second step of controlling a temperature ramping rate from the heat treatment temperature in initial entry to a higher second heat treatment temperature and maintaining in a range of 700° C.–900° C. so as to make the distribution of an oxide precipitate density of the silicon single crystal wafer more uniform after heat treatment, said first step being performed first after a wafer slicing process, said wafer comprising a surface region of up to several tens of μm deep from a wafer surface and a bulk region of several tens or more of μm deep from the wafer surface, said wafer having been prepared from a crystal free from grown-in defects and produced by a Czochralski method, said oxide precipitates being uniformly distributed in the bulk region.

\* \* \* \* \*